(12) United States Patent
Aoki

(10) Patent No.: US 6,901,569 B2
(45) Date of Patent: May 31, 2005

(54) CORRECTED MASK PATTERN VERIFICATION APPARATUS AND CORRECTED MASK PATTERN VERIFICATION

(75) Inventor: Eiji Aoki, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 10/613,691

(22) Filed: Jul. 7, 2003

(65) Prior Publication Data

US 2004/0006758 A1 Jan. 8, 2004

(30) Foreign Application Priority Data

Jul. 5, 2002 (JP) ....................................... 2002-197993

(51) Int. Cl.[7] .............................................. G06F 17/50
(52) U.S. Cl. ............................ 716/5; 716/19; 716/20; 716/21; 430/5; 430/30
(58) Field of Search ............... 716/5, 19–21; 430/5, 30

(56) References Cited

U.S. PATENT DOCUMENTS

| | | | | |
|---|---|---|---|---|
| 6,077,310 A | * | 6/2000 | Yamamoto et al. | 716/19 |
| 6,440,619 B1 | * | 8/2002 | Feldman | 430/30 |
| 6,665,857 B2 | * | 12/2003 | Ayres | 716/19 |
| 6,704,921 B2 | * | 3/2004 | Liu | 716/19 |
| 6,821,689 B2 | * | 11/2004 | Pierrat | 430/5 |

FOREIGN PATENT DOCUMENTS

JP 11-174659 A 7/1999

* cited by examiner

*Primary Examiner*—Vuthe Siek
(74) *Attorney, Agent, or Firm*—Nixon & Vanderhye P.C.

(57) ABSTRACT

A corrected mask pattern verification apparatus includes a graphic operation section for generating differential mask pattern data based on design mask pattern and corrected mask pattern; a graphic reduction-enlargement operation section for reducing the differential mask pattern data and enlarging the reduced differential mask pattern data, and generating graphic reduction-enlargement operation data; and an area comparison operation section for calculating an area of a differential mask pattern represented by the differential mask pattern data and comparing the calculated area with a prescribed area, and generating area comparison operation data indicating an area comparison operation result.

9 Claims, 15 Drawing Sheets

Pattern 7(a)

Pattern 7(b)

Pattern 7(c)

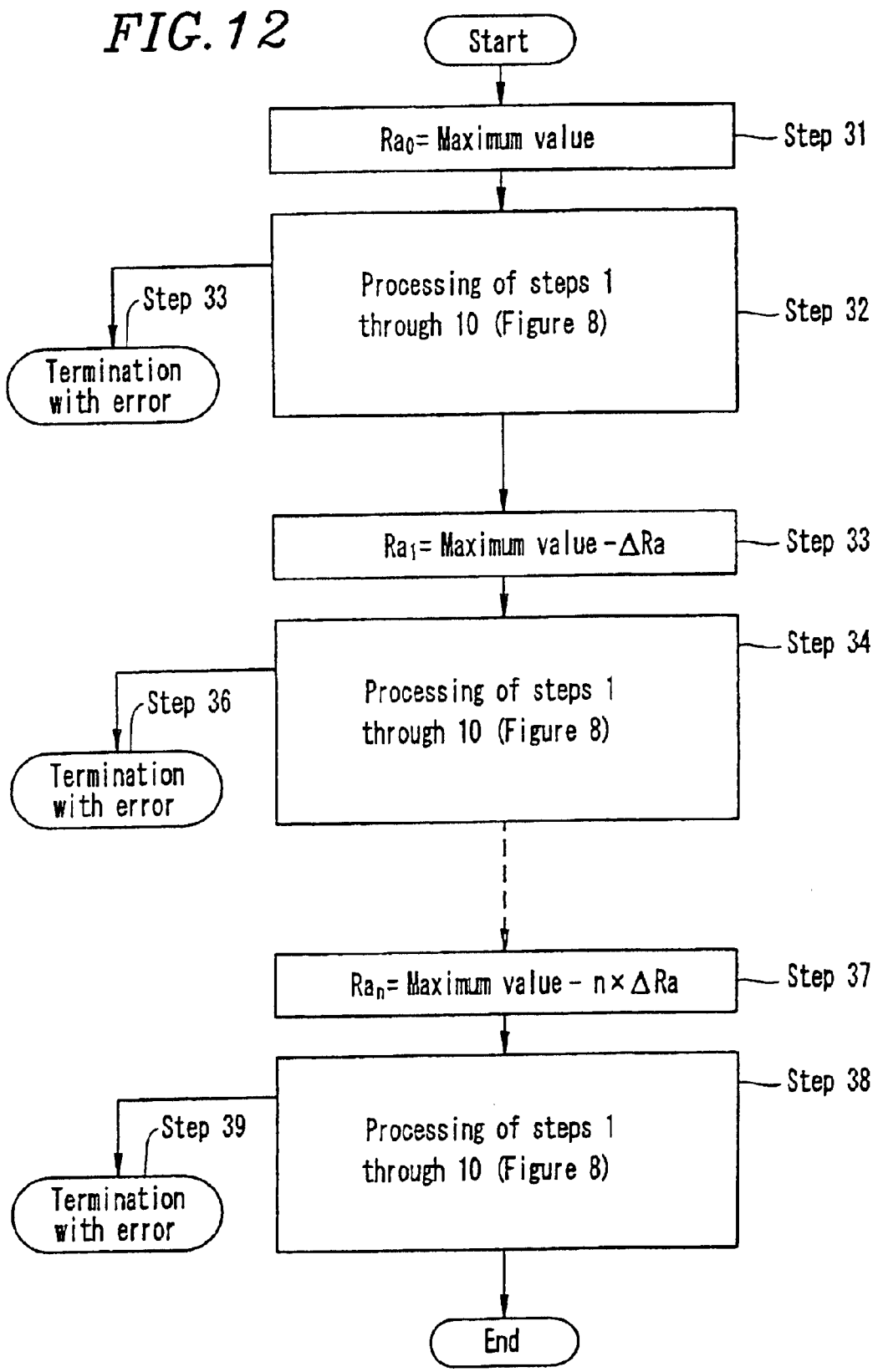

CORRECTED MASK PATTERN VERIFICATION APPARATUS AND CORRECTED MASK PATTERN VERIFICATION

BACKGROUND OF THE INVENTION

1. Field of the Invention

The present invention relates to a corrected mask pattern verification apparatus and a corrected mask pattern verification method for verifying that a pattern of a corrected mask has been properly corrected. More specifically, the present invention relates to a corrected mask pattern verification apparatus and a corrected mask pattern verification method for verifying that correction of a pattern of an exposure mask in consideration of the influence of the optical proximity effect, generated when exposing the exposure mask to light, has been properly performed.

2. Description of the Related Art

In a production process of a semiconductor integrated circuit, photolithography is performed a plurality of times. In a photolithography step, a photomask is formed as an exposure mask. The photomask has a pattern corresponding to a layout of the semiconductor integrated circuit represented by design data for the semiconductor integrated circuit. In the photolithography step, the photomask is exposed to light on a wafer so as to transfer the pattern of the layout onto the wafer.

Such a photomask generally has the same pattern as that of a light shielding portion of a photoresist layer formed on a quartz substrate. The pattern of the photomask is formed based on the pattern of the light shielding portion and a light transmitting portion of the photoresist layer.

Recently, as semiconductor integrated circuits are increasingly reduced in size, the patterns of the layout of the semiconductor integrated circuits are also increasingly becoming smaller. In accordance with this, the patterns of the photomasks are also becoming smaller.

When a pattern of a photomask is extremely small, interference caused by diffraction of light influences the pattern transferred onto the wafer. As a result, the pattern transferred onto the wafer may be significantly different from the pattern represented by the design data. In this case, malfunctions may occur, which lowers the production yield of the semiconductor integrated circuits.

Hereinafter, the influence of interference on the pattern transferred onto the wafer will be described.

FIG. 18 shows a corner of a pre-correction (original) mask 51. FIG. 19 shows a corner of a pattern 52 transferred onto a wafer by exposing the pre-correction mask 51 shown in FIG. 18 to light. The corner of the pattern 52 is rounded due to interference, and loses a corner portion 52a.

In order to suppress the influence of interference of light on the pattern transferred onto a wafer, a technology referred to as optical proximity effect correction (OPC) has been developed. The processing used by this technology (OPC processing) is performed as follows. The influence of interference of light on the pattern transferred onto the wafer is evaluated by optical simulation or using test patterns transferred onto the wafer by exposure to light. Based on the evaluation results, the pattern of the photomask is corrected such that the pattern transferred onto the wafer reproduces the pattern represented by the design data. The pattern transferred onto the wafer by exposing the photomask having a corrected pattern reproduces the pattern represented by the design data with higher fidelity than a photomask having a non-corrected pattern.

Hereinafter, the OPC processing will be described.

FIG. 20 shows a corrected mask 53 having a pattern corrected by the OPC processing. The corrected mask 53 has a projection 53a at the corner of the original mask 51 (FIG. 18).

FIG. 21 shows a corner of a pattern 54 transferred onto a wafer by exposing the corrected mask 53 shown in FIG. 20 to light. The corner of the pattern 54 is rounded by interference, and loses a corner portion 54a. However, the pattern 54 obtained using the corrected mask 53 reproduces the design data with higher fidelity than the pattern 52 (FIG. 19) obtained using the pre-corrected mask 51.

There are two principal methods for correcting a pattern by the OPC processing for producing a semiconductor integrated circuit. According to method 1, the degree of correction is determined based on an optical simulation and the pattern is corrected (simulation-based OPC). According to method 2, pattern correction is performed based on a specific rule for each pattern (rule-based OPC).

Generally, method 2 is inferior to, but consumes less time than, method 1. In general, method 1 or method 2 is used in accordance with the required precision of the pattern.

The OPC processing corrects the entire pattern of the photomask used for producing a semiconductor integrated circuit. More specifically, the photomask is divided into small regions (having sides of several micrometers to several hundred micrometers), and each of the small divided regions is corrected. Each side of each pattern is required to be sufficiently longer than the wavelength of light, but should also be appropriately short such that the amount of data is sufficiently small to be processed at one time regardless of the performance of the computer used.

The border regions between adjacent small regions may not be properly corrected for the following three reasons: (1) the adjacent small regions are corrected based on different standards; (2) the standards for correction depend on how the border line is set; and (3) incorrect processing is performed by a correction program or a computer.

When the pattern of the photomask cannot be properly corrected, the pattern represented by the design data cannot be reproduced with high fidelity. As a result, pseudo defects are generated in the pattern of the photomask during the mask formation step, which lowers the production yield, and increases the cost of the semiconductor integrated circuits.

In order to ensure that a photomask having a properly corrected pattern is produced, methods for verifying that proper correction has been performed have been proposed.

Japanese Laid-Open Publication No. 11-174659 discloses a method for verifying that proper correction has been performed. The method disclosed in Japanese Laid-Open Publication No. 11-174659 includes the step of determining whether or not a corrected mask pattern is encompassed in a mask pattern obtained by enlarging an original mask, and the step of determining whether or not a mask pattern obtained by reducing the original mask is encompassed in the corrected mask pattern.

FIG. 22 shows the corrected mask pattern verification method disclosed in Japanese Laid-Open Publication No. 11-174659. This method will be described with reference to FIG. 22.

Original mask pattern data (design mask pattern data) 11 and corrected mask pattern data (post-correction mask pattern data) 12 are input to a corrected mask pattern verification apparatus. The original mask pattern data 11 represents the pattern of an original mask. The corrected mask pattern data 12 represents the pattern of a corrected mask.

The original mask pattern data 11 is processed by graphic reduction operation 13, thereby generating reduced mask pattern data, and also processed by graphic enlargement operation 14, thereby generating enlarged mask pattern data.

The generated reduced mask pattern data and the corrected mask pattern data 12 are processed by graphic differential operation 15, thereby generating first differential mask pattern data. The first differential mask pattern data indicates how much of a reduced mask pattern represented by the reduced mask pattern data is encompassed in a corrected mask pattern represented by the corrected mask pattern data 12.

Based on the first differential mask pattern data, determination 17 is performed, thereby generating first determination data which indicates whether or not the reduced mask pattern is encompassed in the corrected mask pattern.

The generated enlarged mask pattern data and the corrected mask pattern data 12 are processed by graphic differential operation 16, thereby generating second differential mask pattern data. The second differential mask pattern data indicates how much of the corrected mask pattern represented by the corrected mask pattern data 12 is encompassed in the enlarged mask pattern represented by the enlarged mask pattern data.

Based on the second differential mask pattern data, determination 18 is performed, thereby generating second determination data which indicates whether or not the corrected mask pattern is encompassed in the enlarged mask pattern.

Whether or not the corrected mask has been properly corrected is determined based on the first determination data and the second determination data. When the first determination data indicates that "the reduced mask pattern is encompassed in the corrected mask pattern" and the second determination data indicates that "the corrected mask pattern is encompassed in the enlarged mask pattern", the corrected mask is determined to have been properly corrected.

FIG. 23 shows an exemplary original pattern 11a represented by the original mask pattern data 11. The original pattern 11a is L-shaped as shown in FIG. 23.

FIG. 24 shows an exemplary enlarged mask pattern 14a represented by the enlarged mask pattern data. The enlarged mask pattern 14a is also L-shaped. Each of the sides of the enlarged mask pattern 14a is uniformly longer than each corresponding side of the original mask pattern 11a.

According to the method disclosed in Japanese Laid-Open Publication No. 11-174659, abnormal correction may not be detected. The reason is that even when the first determination data indicates that "the reduced mask pattern is encompassed in the corrected mask pattern" and the second determination data indicates that "the corrected mask pattern is encompassed in the enlarged mask pattern", the corrected mask may have been abnormally corrected.

Such a case will be described below.

FIG. 25 shows an exemplary corrected mask pattern 55 having an unnecessary pattern 55a.

FIG. 26 shows an exemplary corrected mask pattern 56 lacking a necessary pattern 56a.

The corrected mask pattern 55 and the corrected mask pattern 56, neither of which is a properly corrected mask pattern, are both determined as a properly corrected mask pattern by the method disclosed in Japanese Laid-Open Publication No. 11-174659. The reason is that the first determination data indicates that "the reduced mask pattern is encompassed in the corrected mask pattern" and the second determination data indicates that "the corrected mask pattern is encompassed in the enlarged mask pattern". The size of the corrected mask pattern 55 and the size of the corrected mask pattern 56 are substantially the same as the size of the proper corrected mask pattern.

Japanese Laid-Open Publication No. 11-184064 discloses a corrected mask pattern verification method for verifying that the corrected mask pattern has been properly corrected by comparing an original mask pattern and a corrected mask pattern based on an optical simulation. This method, however, increases the cost of the semiconductor integrated circuits, since the operation steps such as Fourier transform steps performed by a computer extends the processing time.

SUMMARY OF THE INVENTION

According to one aspect of the invention, a corrected mask pattern verification apparatus for verifying that corrected mask pattern data generated based on design mask pattern data has been properly corrected is provided. The corrected mask pattern verification apparatus includes a graphic operation section for performing a prescribed graphic operation based on the design mask pattern data and the corrected mask pattern data so as to generate differential mask pattern data indicating a result of the prescribed graphic operation; a graphic reduction-enlargement operation section for reducing the differential mask pattern data and enlarging the differential mask pattern data obtained by the reduction, and generating graphic reduction-enlargement operation data indicating a graphic reduction-enlargement operation result; a first determination section for determining whether or not the graphic reduction-enlargement operation data includes the differential mask pattern, and generating first determination result data indicating a determination result thereof; an area comparison operation section for calculating an area of a differential mask pattern represented by the differential mask pattern data and comparing the calculated area with a prescribed area, and generating area comparison operation data indicating an area comparison operation result; a second determination section for determining whether or not the area comparison operation data includes the differential mask pattern data and generating second determination result data indicating a determination result thereof; and a third determination section for determining whether or not the corrected mask pattern data has been properly corrected based on the first determination result data and the second determination result data.

In one embodiment of the invention, the result of the prescribed graphic operation is a graphic difference obtained from the design mask pattern data and the corrected mask pattern data.

In one embodiment of the invention, the result of the prescribed graphic operation is a graphic exclusive-OR obtained from the design mask pattern data and the corrected mask pattern data.

According to another aspect of the invention, a corrected mask pattern verification method for verifying that corrected mask pattern data generated based on design mask pattern data has been properly corrected is provided. The corrected mask pattern verification method includes (a) a first graphic differential operation step of deleting the design mask pattern data from the corrected mask pattern data, thereby generating first differential mask pattern data representing a first differential mask pattern; (b) a first graphic reduction-enlargement operation step of performing a first reduction on the first differential mask pattern data and then performing a first enlargement on the first mask pattern data obtained by the first reduction, thereby generating first graphic reduction-enlargement operation data indicating a first graphic reduction-enlargement operation result; (c) a first determination step of determining whether or not the first graphic reduction-enlargement operation data includes the first differential mask pattern data, thereby generating first determination result data indicating a result thereof; (d) a first area comparison operation step of calculating an area of the first differential mask pattern based on the first differential mask pattern data, and comparing the area of the first differential mask pattern with a first prescribed area, thereby generating first area comparison operation data indicating a result thereof; (e) a second determination step of determining whether or not the first area comparison operation data includes the first differential mask pattern data, thereby generating second determination result data indicating a result thereof; (f) a second graphic differential operation step of deleting the corrected mask pattern data from the design mask pattern data, thereby generating second differential mask pattern data representing a second differential mask pattern; (g) a second graphic reduction-enlargement operation step of performing a second reduction on the second differential mask pattern data and then performing a second enlargement on the second mask pattern data obtained by the second reduction, thereby generating second graphic reduction-enlargement operation data indicating a second graphic reduction-enlargement operation result; (h) a third determination step of determining whether or not the second graphic reduction-enlargement operation data includes the second differential mask pattern data, thereby generating third determination result data indicating a result thereof; (i) a second area comparison operation step of calculating an area of the second differential mask pattern based on the second differential mask pattern data, and comparing the area of the second differential mask pattern with a second prescribed area, thereby generating second area comparison operation data indicating a result thereof; (j) a fourth determination step of determining whether or not the second area comparison operation data includes the second differential mask pattern data, thereby generating fourth determination result data indicating a result thereof; and (k) a fifth determination step of determining whether or not the corrected mask pattern data has been properly corrected based on the first determination result data, the second determination result data, the third determination result data, and the fourth determination result data.

In one embodiment of the invention, the first reduction shortens each of the sides of the first differential mask pattern by a first prescribed amount. The first enlargement extends each of the sides of the first differential mask pattern obtained by the first reduction by a second prescribed amount. The second reduction shortens each of the sides of the second differential mask pattern by a third prescribed amount. The second enlargement extends each of the sides of the second differential mask pattern obtained by the second reduction by a fourth prescribed amount. The corrected mask pattern includes a plurality of regions. The corrected mask pattern verification method further includes (l) performing steps (a) through (k) for each of the plurality of regions. For each performance of step (l), the first prescribed amount, the second prescribed amount, the third prescribed amount, the fourth prescribed amount, the first prescribed area, and the second prescribed area are set.

In one embodiment of the invention, the first reduction shortens each of the sides of the first differential mask pattern by a first prescribed amount. The first enlargement extends each of the sides of the first differential mask pattern obtained by the first reduction by a second prescribed amount. The second reduction shortens each of the sides of the second differential mask pattern by a third prescribed amount. The second enlargement extends each of the sides of the second differential mask pattern obtained by the second reduction by a fourth prescribed amount. The corrected mask pattern verification method further includes (m) performing steps (a) through (k). For each performance of step (m), the first prescribed amount, the second prescribed amount, the third prescribed amount, and the fourth prescribed amount are each shortened by a prescribed length. Each of the shortened first prescribed amount, the shortened second prescribed amount, the shortened third prescribed amount, and the shortened fourth prescribed amount is set as a maximum correction amount based on the result obtained by step (k) which is performed each time step (m) is performed.

According to still another aspect of the invention, a corrected mask pattern verification method for verifying that corrected mask pattern data generated based on design mask pattern data has been properly corrected is provided. The corrected mask pattern verification method includes (a) a graphic operation step of generating a differential mask pattern data representing an exclusive-OR of the design mask pattern data and the corrected mask pattern data; (b) a graphic reduction-enlargement operation step of performing a reduction on the differential mask pattern data and then performing an enlargement on the differential mask pattern data obtained by the reduction, thereby generating graphic reduction-enlargement operation data indicating a graphic reduction-enlargement operation result; (c) a first determination step of determining whether or not the graphic reduction-enlargement operation data includes the differential mask pattern data, thereby generating first determination result data indicating a result thereof; (d) an area comparison operation step of calculating an area of the differential mask pattern based on the differential mask pattern data, and comparing the calculated area of the differential mask pattern with a prescribed area, thereby generating area comparison operation data indicating a result thereof; (e) a second determination step of determining whether or not the area comparison operation data includes the differential mask pattern data, thereby generating second determination result data indicating a result thereof; and (f) a third determination step of determining whether or not the corrected mask pattern data has been properly corrected based on the first determination result data and the second determination result data.

In one embodiment of the invention, the reduction shortens each of the sides of the differential mask pattern by a first prescribed amount. The enlargement extends each of the sides of the differential mask pattern obtained by the reduction by a second prescribed amount. The corrected mask pattern includes a plurality of regions. The corrected mask pattern verification method further includes (g) performing steps (a) through (f) for each of the plurality of regions. For each performance of step (g), the first prescribed amount, the second prescribed amount, and the prescribed area are set.

In one embodiment of the invention, the reduction shortens each of the sides of the differential mask pattern by a first prescribed amount. The enlargement extends each of the sides of the differential mask pattern obtained by the reduction by a second prescribed amount. The corrected mask pattern verification method further includes (h) performing steps (a) through (f). For each performance of step (h), the first prescribed amount and the second prescribed amount are each shortened by a prescribed length. Each of the shortened first prescribed amount and the shortened second prescribed amount is set as a maximum correction amount of the corrected mask pattern based on the result obtained by step (f) which is performed each time step (h) is performed.

A corrected mask pattern verification apparatus according to the present invention obtains differential mask pattern data based on a graphic difference or a graphic exclusive-OR from corrected mask pattern data and original mask pattern data. The differential mask pattern data is processed by a graphic reduction-enlargement operation and also by area comparison operation.

When the corrected mask pattern has a desired size, no differential mask pattern is left as a result of graphic reduction-enlargement operation of the differential mask pattern data. Thus, it can be detected that the corrected mask pattern has been properly corrected.

When the corrected mask pattern has a size larger than a desired size, at least a portion of the differential mask pattern is left as a result of graphic reduction-enlargement operation of the differential mask pattern data. Thus, it can be detected that the corrected mask pattern has not been properly corrected.

As a result of the area comparison operation of the differential mask pattern data, it can be determined whether or not the area of the differential mask pattern is within a prescribed range. When the area of the differential mask pattern is outside the prescribed range, the corrected mask pattern is determined not to have been properly corrected.

A mask pattern properly corrected reproduces the pattern of the layout of the semiconductor integrated circuit represented by the design data with high fidelity. Therefore, the resultant semiconductor integrated circuit operates properly. This improves the production yield of, and lowers the cost of, the semiconductor integrated circuit.

Thus, the invention described herein makes possible the advantages of providing a corrected mask pattern verification apparatus and a corrected mask pattern verification method for verifying, at high speed and low cost, that correction of an exposure mask pattern in consideration of the influence of the optical proximity effect, generated when exposing the exposure mask to light, has been properly performed.

These and other advantages of the present invention will become apparent to those skilled in the art upon reading and understanding the following detailed description with reference to the accompanying figures.

BRIEF DESCRIPTION OF THE DRAWINGS

FIG. 12 is a flowchart illustrating a method for obtaining the maximum modification width Ramod;

FIG. 13 shows an OPC mask pattern 62a;

DESCRIPTION OF THE PREFERRED EMBODIMENTS

Hereinafter, the present invention will be described by way of illustrative examples with reference to the accompanying drawings.

Figure 1:
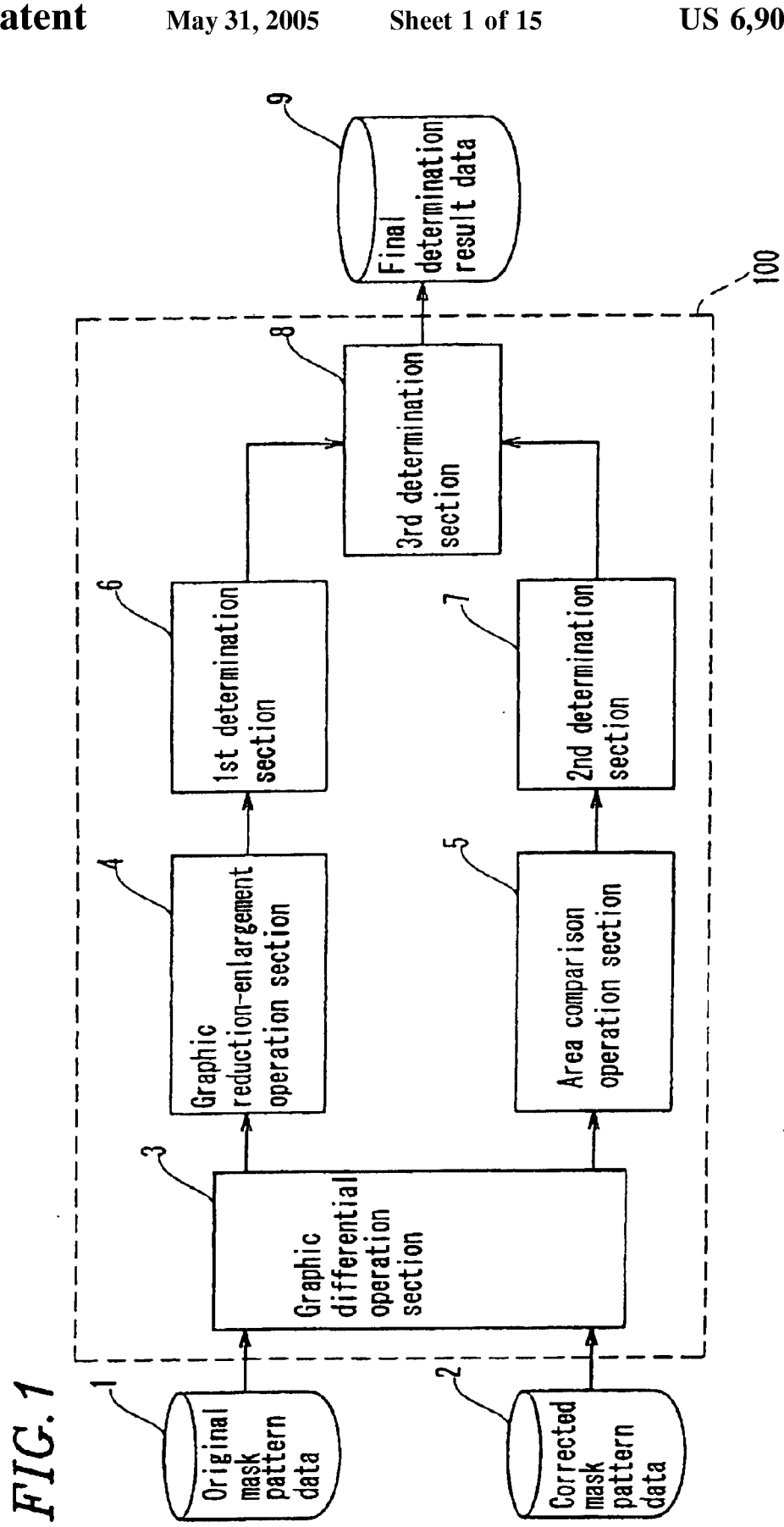
FIG. 1 shows a structure of a corrected mask pattern verification apparatus 100 according to an example of the present invention.

FIG. 1 shows a structure of a corrected mask pattern verification apparatus 100 according to an example of the present invention.

The corrected mask pattern verification apparatus 100 includes a graphic differential operation section 3, a graphic reduction-enlargement operation section 4, an area comparison operation section 5, a first determination section 6, a second determination section 7, and a third determination section 8.

The graphic differential operation section 3 receives original mask pattern data (design mask pattern data) 1 and corrected mask pattern data (post-correction mask pattern data) 2. The original mask pattern data 1 represents the pattern of an original mask. The corrected mask pattern data 2 represents the pattern of a corrected mask.

Based on the original mask pattern data 1 and the corrected mask pattern data 2, the graphic differential operation section 3 performs a prescribed graphic differential operation and generates differential mask pattern data, which represents the result of the prescribed graphic differential operation. The differential mask pattern data represents at least a part of a portion which is different between the original mask pattern data 1 and the corrected mask pattern data 2.

The differential mask pattern data is output from the graphic differential operation section 3 to the graphic reduction-enlargement operation section 4 and the area comparison operation section 5.

The graphic reduction-enlargement operation section 4 processes the differential mask pattern data with a graphic reduction-enlargement operation. The graphic reduction-enlargement operation is an operation of reducing the differential mask pattern represented by the differential mask pattern data and enlarging the reduced differential mask pattern.

When the size of the differential mask pattern is equal to the size to be applied for correction (desired size), there is no differential mask pattern left after the reduction. Therefore, the graphic reduction-enlargement operation section 4 outputs data which does not include the post-graphic reduction-enlargement operation differential mask pattern data to the first determination section 6. When the size of the differential mask pattern is larger than the size to be applied for correction, there is a portion of the differential mask pattern left after the reduction. Therefore, the graphic reduction-enlargement operation section 4 outputs data which includes the post-graphic reduction-enlargement operation differential mask pattern data to the first determination section 6.

The first determination section 6 determines whether or not the data which is output from the graphic reduction-enlargement operation section 4 includes the post-graphic reduction-enlargement operation differential mask pattern data, and generates first determination data. The first determination data indicates whether or not the data which is output from the graphic reduction-enlargement operation section 4 to the first determination section 6 includes the post-graphic reduction-enlargement operation differential mask pattern data.

The first determination section 6 then outputs the first determination data to the third determination section 8.

The area comparison operation section 5 processes the differential mask pattern data which is output from the graphic differential operation section 3 with area comparison operation. The area comparison operation is an operation of calculating the area of the differential mask pattern based on the differential mask pattern data and comparing the area of the differential mask pattern and a prescribed area.

When the area of the differential mask pattern is outside a prescribed area range, the area comparison operation section 5 outputs data which includes the differential mask pattern data to the second determination section 7. When the area of the differential mask pattern is within the prescribed area range, the area comparison operation section 5 outputs data which does not include the differential mask pattern data to the second determination section 7.

The second determination section 7 determines whether or not the data which is output from the area comparison operation section 5 includes the differential mask pattern data, and generates second determination data. The second determination data indicates whether or not the data which is output from the area comparison operation section 5 to the second determination section 7 includes the differential mask pattern data.

Based on the first determination data and the second determination data, the third determination section 8 determines whether or not the corrected mask pattern has been properly corrected. The third determination section 8 then generates final determination result data 9. The final determination result data 9 indicates whether or not the corrected mask pattern data 2 represents the properly corrected mask pattern.

When the final determination result data indicates that "the corrected mask pattern data 2 represents the properly corrected mask pattern", the corrected mask pattern verification apparatus 100 determines that correction of the corrected mask has been properly performed.

Hereinafter, how a mask pattern is processed by the graphic differential operation section 3, the graphic reduction-enlargement operation section 4, the area comparison operation section 5, the first determination section 6, the second determination section 7, and the third determination section 8 will be described in detail.

Figure 2:
FIG. 2 shows an original mask pattern 61 represented by original mask pattern data 1 shown in FIG. 1.

FIG. 2 shows an original mask pattern 61 represented by original mask pattern data. The original mask pattern 61 is polygonal.

Figure 3:
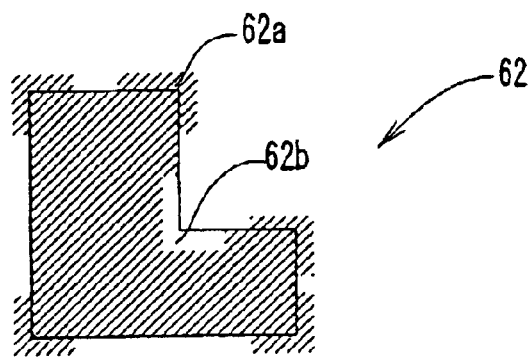
FIG. 3 shows a corrected mask pattern 62 represented by corrected mask pattern data 2 shown in FIG. 1.

FIG. 3 shows a corrected mask pattern 62 represented by the corrected mask pattern data 2.

The corrected mask pattern 62 is generated by OPC-processing the original mask pattern 61. The corrected mask pattern 62 includes OPC mask patterns 62a at convex corners of the original mask pattern 61 and an OPC mask pattern 62b at a concave corner of the original mask pattern 61. The OPC mask patterns 62a are projecting, and the OPC mask pattern 62b is recessed. Owing to the OPC mask patterns 62a and 62b, the corners of the pattern transferred onto a wafer by exposing the corrected mask pattern 62 can be prevented from being rounded.

The graphic differential operation section 3 obtains a graphic difference between the original mask pattern data 1 and the corrected mask pattern data 2 by the graphic operation. The graphic differential operation section 3 generates the differential mask pattern data, which represents the obtained graphic difference.

The graphic difference is obtained from two types of mask pattern data which are to be subjected to the operation. More specifically, the graphic difference is a pattern obtained by deleting one type of data from the other type of data. For example, when the two types of data each have a plurality of bits, the pattern is obtained by subtracting the logical value of each of the plurality of bits of one type of data from the logical value of the corresponding bit of the other type of data. It is assumed that the result of subtraction of the logical value "1" from the logical value "0" is the logical value "0". The subtraction is represented by the following logical operations.

Logical value "1"–logical value "1"=logical value "0"

Logical value "1"–logical value "0"=logical value "1"

Logical value "0"–logical value "1"=logical value "0"

Logical value "0"–logical value "0"=logical value "0"

The graphic differential operation section 3 generates first differential mask pattern data by deleting the original mask pattern data 1 from the corrected mask pattern data 2. The graphic differential operation section 3 also generates second differential mask pattern data by deleting the corrected mask pattern data 2 from the original mask pattern data 1.

The first differential mask pattern data and the second differential mask pattern data are output to the graphic reduction-enlargement operation section 4. The first differential mask pattern data and the second differential mask pattern data are also output to the area comparison operation section 5.

Figure 4:
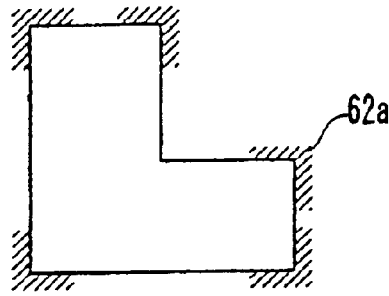
FIG. 4 shows an exemplary first differential mask pattern represented by first differential mask pattern data.

FIG. 4 shows a first differential mask pattern or an OPC mask pattern 62a (hatched portion) represented by the first differential mask pattern data, obtained by the graphic differential operation section 3 by deleting data representing the original mask pattern 61 (FIG. 2) from data representing the corrected mask pattern 62 (FIG. 3).

Figure 5:
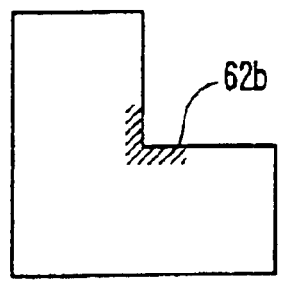
FIG. 5 shows an exemplary second differential mask pattern represented by second differential mask pattern data.

FIG. 5 shows a second differential mask pattern or an OPC mask pattern 62b (hatched portion) represented by the second differential mask pattern data, obtained by the graphic differential operation section 3 by deleting data representing the corrected mask pattern 62 (FIG. 3) from the data representing the original mask pattern 61 (FIG. 2).

The present invention is not limited to generating both the first differential mask pattern data and the second differential mask pattern data. For example, when there is no graphic difference obtained by deleting the original mask pattern data 1 from the corrected mask pattern data 2, the first differential mask pattern data does not need to be generated. When there is no graphic difference obtained by deleting the corrected mask pattern data 2 from the original mask pattern data 1, the second differential mask pattern data does not need to be generated.

The graphic reduction-enlargement operation section 4 processes each of the first differential mask pattern data and the second differential mask pattern data with the graphic reduction-enlargement operation. As described above, the graphic reduction-enlargement operation is an operation of reducing the differential mask pattern represented by the differential mask pattern data and enlarging the reduced differential mask pattern.

The reduction processing shortens the length of each of the sides of each differential mask pattern by a prescribed amount. The enlargement processing extends the length of each of the sides of each differential mask pattern by a prescribed amount.

When the size of the differential mask pattern is equal to the size to be applied for correction, there is no differential mask pattern left after the reduction. The reason is that each side of the differential mask pattern is shorter than the prescribed amount by which the length of each side is shortened. In this case, data which does not include the post-graphic reduction-enlargement operation differential mask pattern data is output to the first determination section 6.

When the size of the differential mask pattern is larger than the size to be applied for correction, at least a portion of the differential mask pattern is left after the reduction. The reason is that each side of the differential mask pattern is longer than the prescribed amount by which the length of each side is shortened. In this case, data which includes the post-graphic reduction-enlargement operation differential mask pattern data is output to the first determination section 6.

Figure 6:
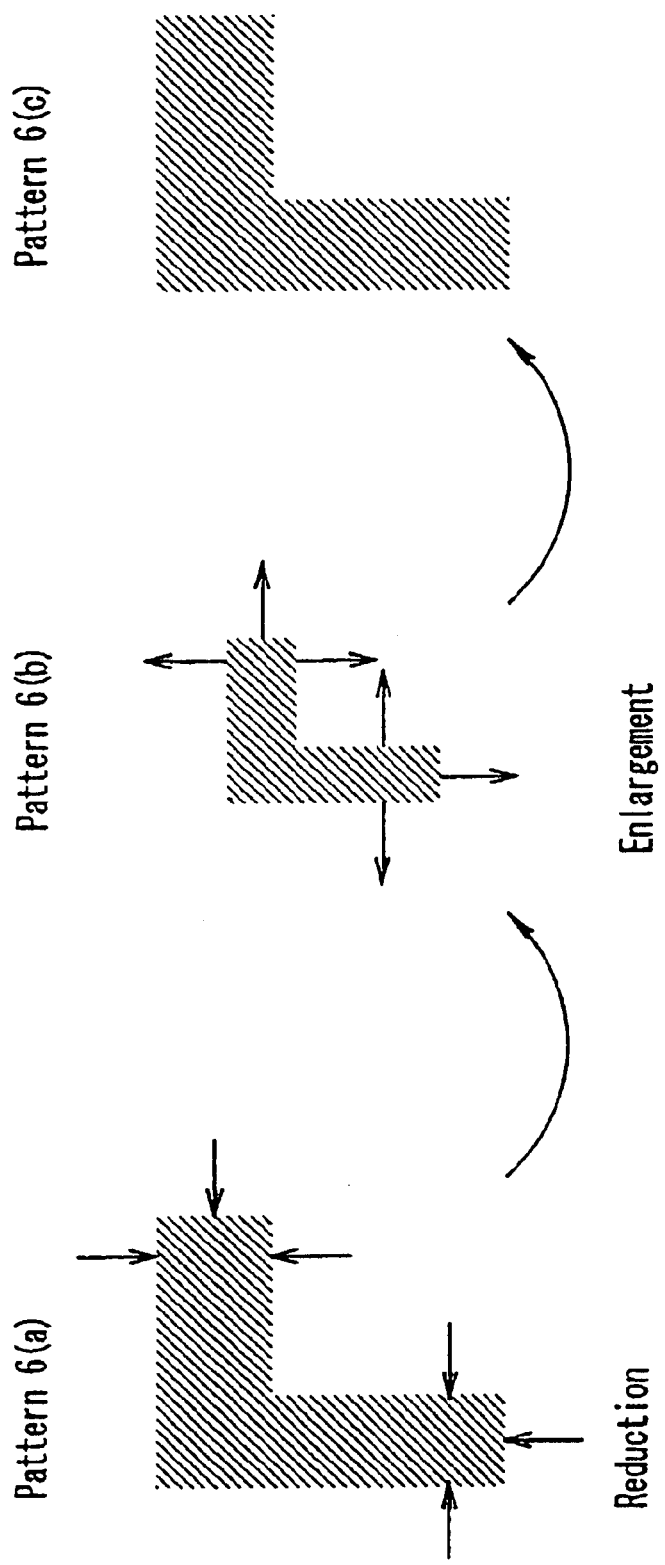
FIG. 6 shows mask patterns represented by differential mask pattern data processed by a graphic reduction-enlargement operation.

FIG. 6 shows mask patterns represented by the differential mask pattern data processed by the graphic reduction-enlargement operation.

Pattern 6(a) is a differential mask pattern which is larger than the size to be applied for correction. Pattern 6(b) is generated by reducing pattern 6(a). Since pattern 6(a) is larger than the size to be applied for correction, at least a portion of the differential mask pattern is left after reduction. Pattern 6(c) is generated by enlarging pattern 6(b).

As described above, the first determination section 6 determines whether or not the data which is output from the graphic reduction-enlargement operation section 4 includes the post-graphic reduction-enlargement operation differential mask pattern data. Then, the first determination section 6 generates and outputs first determination data to the third determination section 8. The first determination data indicates whether or not the data which is output from the graphic reduction-enlargement operation section 4 to the first determination section 6 includes the post-graphic reduction-enlargement operation differential mask pattern data.

When the size of the differential mask pattern is larger than the size to be applied for correction, the corrected mask pattern verification apparatus 100 can verify that the corrected mask pattern has been properly corrected by processing the differential mask pattern by a graphic reduction-enlargement operation. By contrast, when the size of the differential mask pattern is smaller than or equal to the size to be applied for correction, it cannot be verified that the corrected mask pattern has been properly corrected simply by processing the differential mask pattern by the graphic reduction-enlargement operation. The reason is that no differential mask pattern is left after reduction.

In order to overcome this inconvenience, the corrected mask pattern verification apparatus 100 includes the area comparison operation section 5.

The area comparison operation section 5 compares the area of the first differential mask pattern data and the area of the second differential mask pattern data. The area comparison operation calculates an area of a differential mask pattern based on differential mask pattern data and compares the calculated area with a prescribed area.

More specifically, the area comparison operation section 5 calculates an area of the first differential mask pattern based on the first differential mask pattern data, and compares the area of the first differential mask pattern with the prescribed area. The area comparison operation section 5 calculates an area of the second differential mask pattern based on the second differential mask pattern data, and compares the area of the second differential mask pattern with the prescribed area.

As described above, when the area of the differential mask pattern is outside the prescribed area range, the area comparison operation section 5 outputs data which includes the differential mask pattern data to the second determination section 7. When the area of the differential mask pattern is within the prescribed area range, the area comparison operation section 5 outputs data which does not include the differential mask pattern data to the second determination section 7.

Figure 7A:
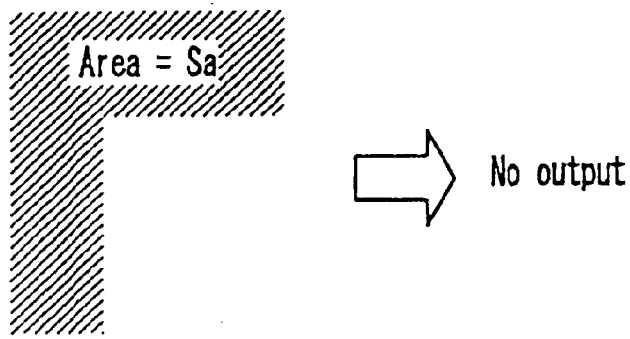
FIGS. 7A through 7C show an example of the area comparison operation performed on the differential mask pattern.
Figure 7B:
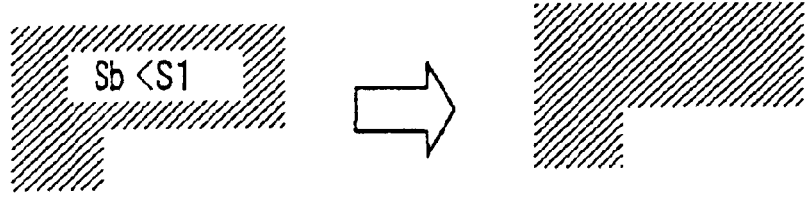
Figure 7C:
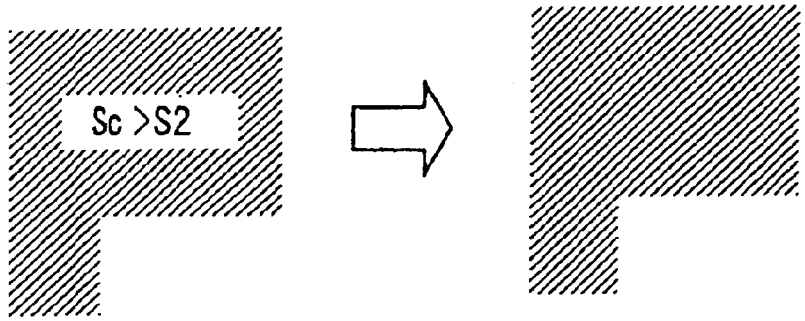

FIGS. 7A through 7C show examples of the area comparison operation performed on the differential mask pattern.

Pattern 7(a) shown in FIG. 7A is a differential mask pattern which is represented by differential mask pattern data which is input to the area comparison operation section 5. The area comparison operation section 5 calculates area $S_a$ of pattern 7(a) based on the differential mask pattern data. Then, the area comparison operation section 5 compares area $S_a$, area S1 and area S2. Area S1 and area S2 define the prescribed area range. In this example, area $S_a$, area S1 and area S2 have the relationship of $S1 \leq S_a \leq S2$, and therefore the area comparison operation section 5 outputs data which does not include the differential mask pattern data to the second determination section 7.

Pattern 7(b) shown in FIG. 7B is another differential mask pattern which is represented by another differential mask pattern data which is input to the area comparison operation section 5. The area comparison operation section 5 calculates area $S_b$ of pattern 7(b) based on the differential mask pattern data. Then, the area comparison operation section 5 compares area $S_b$, area S1 and area S2. In this example, area $S_b$ and area S1 have the relationship of $S_b$<S1, and therefore the area comparison operation section 5 outputs data which includes the differential mask pattern data to the second determination section 7.

Pattern 7(c) shown in FIG. 7C is still another differential mask pattern which is represented by still another differential mask pattern data which is input to the area comparison operation section 5. The area comparison operation section 5 calculates area $S_c$ of pattern 7(c) based on the differential mask pattern data. Then, the area comparison operation section 5 compares area $S_c$, area S1 and area S2. In this example, area $S_c$ and area S2 have the relationship of S2<$S_c$, and therefore the area comparison operation section 5 outputs data which includes the differential mask pattern data to the second determination section 7.

As described above, the second determination section 7 determines whether or not the data which is output from the area comparison operation section 5 includes the differential mask pattern data. Then, the second determination section 7 generates and outputs second determination data to the third determination section 8. The second determination data indicates whether or not the data which is output from the area comparison operation section 5 to the second determination section 7 includes the differential mask pattern data.

When the data which is output from the area comparison operation section 5 to the second determination section 7 does not include the differential mask pattern data, that means that the area of the differential mask pattern is within the prescribed area range. Therefore, the second determination section 7 determines that "the corrected mask pattern has the desired shape."

Owing to the area comparison operation section 5, the corrected mask pattern verification apparatus 100 can verify a pattern which is smaller than a desired pattern and thus cannot be verified by the graphic reduction-enlargement operation section 4.

The third determination section 8 determines whether or not the corrected mask pattern has been properly corrected, based on the first determination data and the second determination data. The third determination section 8 generates and outputs final determination result data, which indicates whether or not the corrected mask pattern data 2 represents the pattern of the properly corrected mask. When the final determination result data indicates that "the corrected mask pattern data 2 represents the pattern of the properly corrected mask", the corrected mask pattern verification apparatus 100 determines that correction of the corrected mask has been properly performed.

In the case where the first determination data indicates that "the data which is output from the graphic reduction-enlargement operation section 4 to the first determination section 6 does not include the differential mask pattern data processed by graphic reduction-enlargement operation" and the second determination data indicates that "the data which is output from the area comparison operation section 5 to the second determination section 7 does not include the differential mask pattern data", the final determination result data which is output from the third determination section 8 shows that the corrected mask pattern has been properly corrected.

Figure 8:
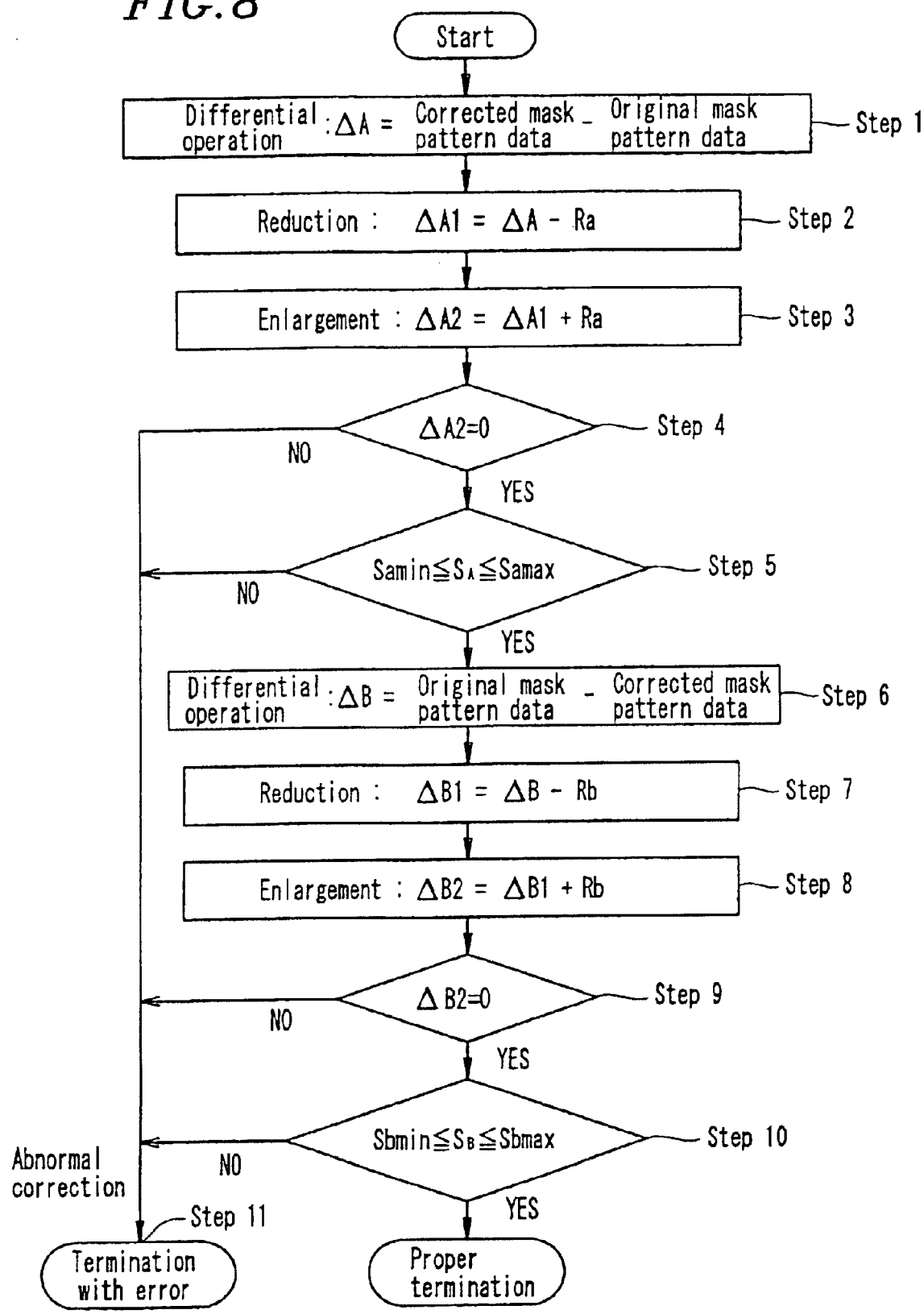
FIG. 8 is a flowchart illustrating a corrected mask pattern verification method according to an example of the present invention.

FIG. 8 is a flowchart illustrating a corrected mask pattern verification method according to the example of the present invention. With reference to FIG. 8, each step of the corrected mask pattern verification method will be described in detail.

Step 1: The graphic differential operation section 3 generates first differential mask pattern data $\Delta A$, which represents the graphic difference obtained from the original mask pattern data 1 and the corrected mask pattern data 2; more specifically, the graphic difference obtained by deleting the original mask pattern data 1 from the corrected mask pattern data 2.

The graphic differential operation section 3 outputs the first differential mask pattern data $\Delta A$ to the graphic reduction-enlargement operation section 4, and also to the area comparison operation section 5.

Step 2: The graphic reduction-enlargement operation section 4 reduces the first differential mask pattern data $\Delta A$, thereby generating data $\Delta A1$. This processing shortens each side of the differential mask pattern by length Ra. Length Ra is the maximum amount by which each side can be expected to be shortened when proper correction is performed.

Step 3: The graphic reduction-enlargement operation section 4 extends data $\Delta A1$, thereby generating data $\Delta A2$. This processing extends each side of the differential mask pattern by length Ra.

The data processed by the graphic reduction-enlargement operation is output from the graphic reduction-enlargement operation section 4 to the first determination section 6.

When at least a part of data $\Delta A2$ is left ($\Delta A2 \neq 0$), the data processed by the graphic reduction-enlargement operation includes data $\Delta A2$. When data $\Delta A2$ is not left ($\Delta A2 = 0$), the data processed by the graphic reduction-enlargement operation does not include data $\Delta A2$.

Step 4: The first determination section 6 determines whether or not the data processed by the graphic reduction-enlargement operation includes data $\Delta A2$.

When the data processed by the graphic reduction-enlargement operation includes data $\Delta A2$, the processing goes to step 11, since in this case, abnormal correction has been performed. In step 11, the corrected mask pattern is modified as necessary.

When the data processed by the graphic reduction-enlargement operation does not include data $\Delta A2$, the processing goes to step 5.

Step 5: The area comparison operation section 5 calculates area $S_A$ of the first differential mask pattern based on the differential mask pattern data $\Delta A$. Then, the area comparison operation section 5 compares area $S_A$, area Samin, and area Samax.

When area $S_A$, area Samin, and area Samax have the relationship of Samin$\leq S_A \leq$Samax, the processing goes to step 6.

When area $S_A$ and area Samin have the relationship of $S_A$<Samin, the processing goes to step 11. When area $S_A$ and area Samax have the relationship of Samax<$S_A$, the processing also goes to step 11.

Area Samin is the minimum area of the differential mask pattern which is expected when proper correction is performed. Area Samax is the maximum area of the differential mask pattern which is expected when proper correction is performed.

After this, the second differential mask pattern $\Delta B$ is processed in steps 6 through 10 in substantially the same manner as that of processing the first differential mask pattern $\Delta A$ in steps 1 through 5.

Step 6: The graphic differential operation section 3 generates second differential mask pattern data $\Delta B$, which represents the graphic difference obtained from the original mask pattern data 1 and the corrected mask pattern data 2; more specifically, the graphic difference obtained by deleting the corrected mask pattern data 2 from the original mask pattern data 1.

The graphic differential operation section 3 outputs the second differential mask pattern data ΔB to the graphic reduction-enlargement operation section 4, and also to the area comparison operation section 5.

Step 7: The graphic reduction-enlargement operation section 4 reduces the second differential mask pattern data ΔB, thereby generating data ΔB1. This processing shortens each side of the differential mask pattern by length Rb. Length Rb is the maximum amount by which each side can be expected to be shortened when proper correction is performed.

Step 8: The graphic reduction-enlargement operation section 4 extends data ΔB1, thereby generating data ΔB2. This processing extends each side of the differential mask pattern by length Rb.

The data processed by the graphic reduction-enlargement operation is output from the graphic reduction-enlargement operation section 4 to the first determination section 6.

When at least a part of data ΔB2 is left (ΔB2≠0), the data processed by the graphic reduction-enlargement operation includes data ΔB2. When data ΔB2 is not left (ΔB2=0), the data processed by a graphic reduction-enlargement operation does not include data ΔB2.

Step 9: The first determination section 6 determines whether or not the data processed by the graphic reduction-enlargement operation includes data ΔB2.

When the data processed by a graphic reduction-enlargement operation includes data ΔB2, the processing goes to step 11, since in this case, abnormal correction has been performed. In step 11, the corrected mask pattern is modified as necessary.

When the data processed by the graphic reduction-enlargement operation does not include data ΔB2, the processing goes to step 10.

Step 10: The area comparison operation section 5 calculates area $S_B$ of the second differential mask pattern based on the differential mask pattern data ΔB. Then, the area comparison operation section 5 compares area $S_B$, area Sbmin, and area Sbmax.

When area $S_B$, area Sbmin, and area Sbmax have the relationship of Sbmin≦$S_B$≦Sbmax, the processing is properly terminated.

When area $S_B$ and area Sbmin have the relationship of $S_B$<Sbmin, the processing goes to step 11. When area $S_B$ and area Sbmax have the relationship of Sbmax<$S_B$, the processing also goes to step 11.

Area Sbmin is the minimum area of the differential mask pattern which is expected when proper correction is performed. Area Sbmax is the maximum area of the differential mask pattern which is expected when proper correction is performed.

In the above example, a graphic difference is used for obtaining a differential mask pattern based on an original mask pattern and a corrected mask pattern. Alternatively, a graphic exclusive-OR may be used for obtaining a differential mask pattern. In this case, processing of extracting non-matching portions between the original mask pattern and the corrected mask pattern is carried out.

When a graphic exclusive-OR is used, values Ra and Rb used by the graphic reduction-enlargement operation section need to be adapted to the largest pattern. Values Samin, Samax, Sbmin and Sbmax used by the area comparison operation also need to be adapted to the largest pattern.

In general, a mask pattern correction amount in accordance with a certain rule is used for all the mask patterns in a logic integrated circuit. However, when regularly arranged mask patterns (for example, mask patterns in memory cells in a memory integrated circuit) are included in mask patterns of a logic integrated circuit, a correction amount which is optimum for the pattern regularity is used for the regularly arranged mask patterns, and a correction amount which is different from the optimum correction amount is used for the mask patterns which are different from those in the memory cells in the memory integrated circuit.

In the case where the correction amount is determined based on a certain rule, values Ra and Rb used by the graphic reduction-enlargement operation section and values Samin, Samax, Sbmin and Sbmax used by the area comparison operation section may be determined in accordance with each of a plurality of regions included in the corrected mask pattern. Since these values are determined in this manner, the corrected mask pattern can be verified more accurately. When the corrected mask pattern is determined for an integrated circuit having two or more different correction rules, appropriate values can be set in accordance with each of the plurality of regions.

Figure 9:
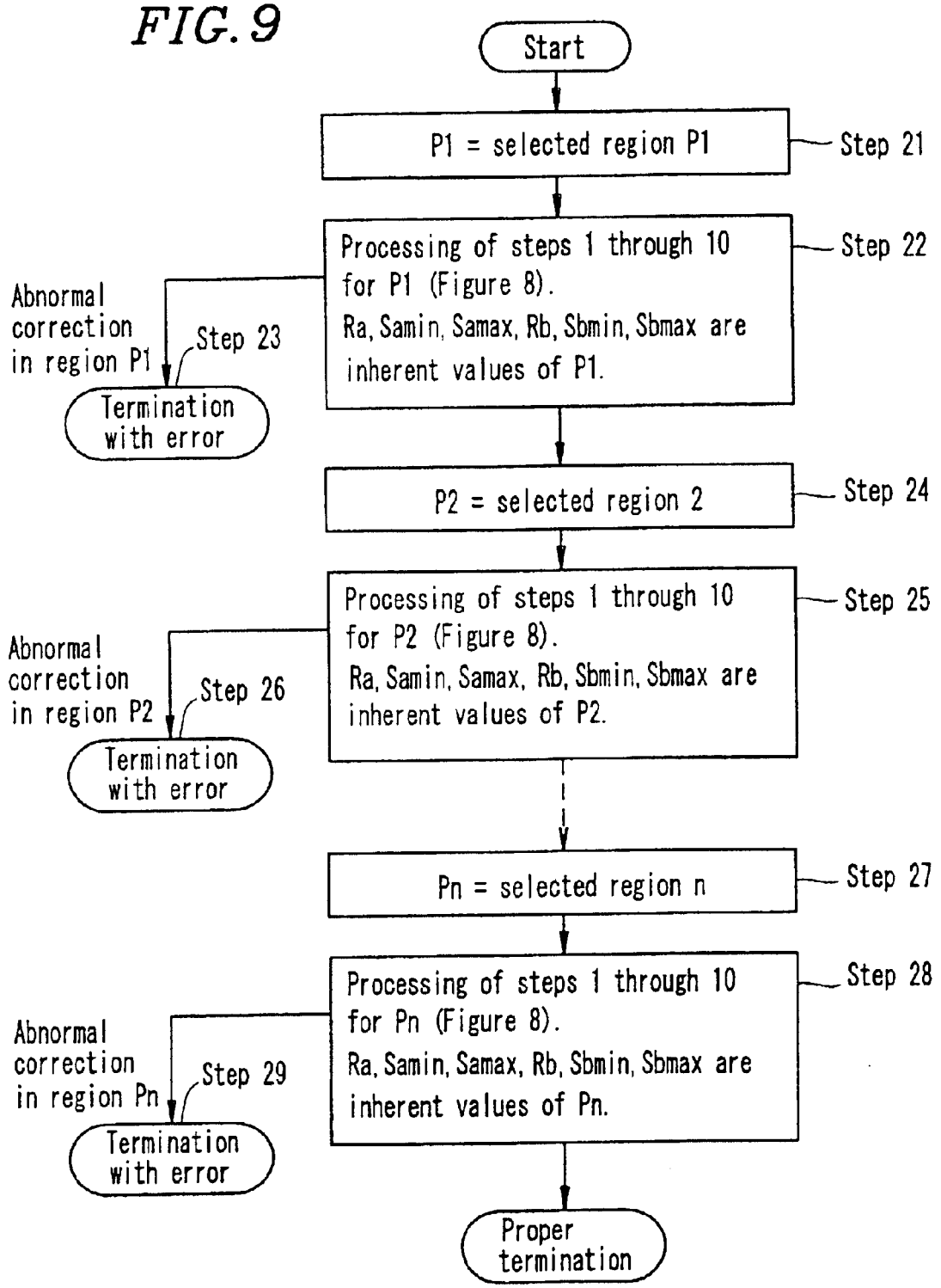
FIG. 9 shows corrected mask pattern verification processing in the case where a plurality of correction rules are applied to one integrated circuit.

FIG. 9 shows corrected mask pattern verification processing in the case where a plurality of correction rules are applied to one integrated circuit.

Step 21: The corrected mask pattern verification apparatus 100 selects region 1 which uses a specific correction rule, from a plurality of regions of the mask pattern. The selected region 1 is referred to as region P1. When a plurality of regions which use different correction rules from each other are included in one mask pattern, that one mask pattern generally includes a pattern covering each of the plurality of regions. The region using the specific correction rule can be selected by addition of the pattern covering each of the plurality of regions and a graphic pattern.

After the corrected mask pattern verification apparatus 100 selects region P1, the processing goes to step 22.

Step 22: The corrected mask pattern verification apparatus 100 performs substantially the same processing as that of steps 1 through 10 (FIG. 8) for the selected region P1. Values Ra, Samin, Samax, Rb, Sbmin and Sbmax are expected when proper correction is performed for region P1 (i.e., values Ra, Samin, Samax, Rb, Sbmin and Sbmax are inherent values of region P1).

When it is determined that "region P1 has not been properly corrected", the processing goes to step 23. When it is determined that "region P1 has been properly corrected", the processing goes to step 24.

Step 23: Since it is determined that "region P1 has not been properly corrected", the processing is terminated.

Step 24: The corrected mask pattern verification apparatus 100 selects region 2 which uses a specific correction rule, from a plurality of regions of the mask pattern. The selected region 2 is referred to as region P2. After the corrected mask pattern verification apparatus 100 selects region P2, the processing goes to step 25.

Step 25: The corrected mask pattern verification apparatus 100 performs substantially the same processing as that of steps 1 through 10 (FIG. 8) for the selected region P2. Values Ra, Samin, Samax, Rb, Sbmin and Sbmax are the expected values when proper correction is performed for region P2 (i.e., values Ra, Samin, Samax, Rb, Sbmin and Sbmax are inherent values of region P2).

When it is determined that "region P2 has not been properly corrected", the processing goes to step 26. When it is determined that "region P2 has been properly corrected", the processing goes to step 27.

Step 26: Since it is determined that "region P2 has not been properly corrected", the processing is terminated.

After this, the corrected mask pattern verification apparatus 100 performs substantially the same processing as that of steps 21 through 23 (FIG. 8) for an arbitrary region n.

Step 27: The corrected mask pattern verification apparatus 100 selects region n which uses a specific correction rule, from a plurality of regions of the mask pattern. The selected region n is referred to as region Pn. After the corrected mask pattern verification apparatus 100 selects region Pn, the processing goes to step 28.

Step 28: The corrected mask pattern verification apparatus 100 performs substantially the same processing as that of steps 1 through 10 (FIG. 8) for the selected region Pn. Values Ra, Samin, Samax, Rb, Sbmin and Sbmax are the expected values when proper correction is performed for region Pn (i.e., values Ra, Samin, Samax, Rb, Sbmin and Sbmax are inherent values of region Pn).

When it is determined that "region Pn has not been properly corrected", the processing goes to step 29. When it is determined that "region Pn has been properly corrected", it is determined that "regions 1 through n have been properly corrected" and the processing is properly terminated.

Step 29: Since it is determined that "region Pn has not been properly corrected", the processing is terminated.

In the case where the correction amount is determined based on simulation, as in the case where the correction amount is determined based on a certain rule, values Ra and Rb used by the graphic reduction-enlargement operation section and values Samin, Samax, Sbmin and Sbmax used by the area comparison operation section can be determined in accordance with each of a plurality of regions included in the corrected mask pattern. Based on, for example, the minimum pattern permitted by the design rule which defines the design of the original mask pattern, the maximum correction amount can be determined.

Figure 10A:
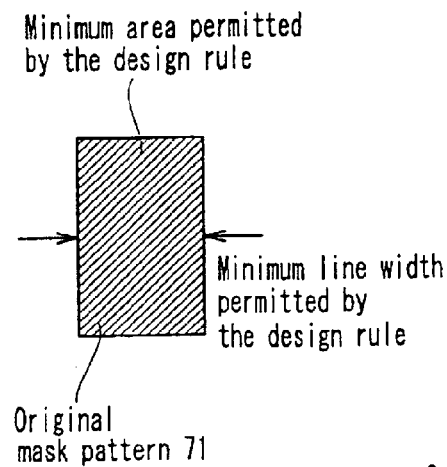
FIGS. 10A and 10B show exemplary evaluation original mask patterns.
Figure 10B:
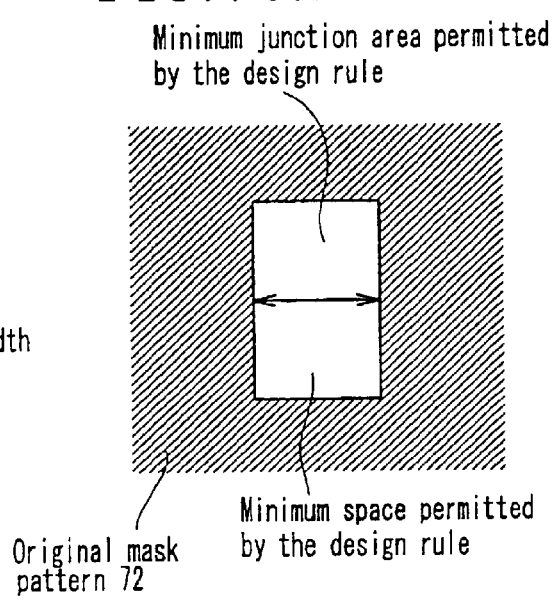

FIGS. 10A and 10B show exemplary evaluation original mask patterns. An original mask pattern 71 shown in FIG. 10A and an original mask pattern 72 shown in FIG. 10B are both evaluation original mask patterns. The width of the original mask pattern 71 is the minimum line width permitted by the design rule, and the area of the original mask pattern 71 is the minimum area permitted by the design rule.

The original mask pattern 72 includes the minimum space permitted by the design rule, and also the minimum junction area permitted by the design rule.

Distinctive patterns such as memory cell patterns can be, for example, created for evaluation original mask patterns (test patterns) instead of the original mask patterns 71 and 72. An evaluation original mask pattern is OPC-processed based on simulation so as to create an evaluation corrected mask pattern.

Figure 11A:
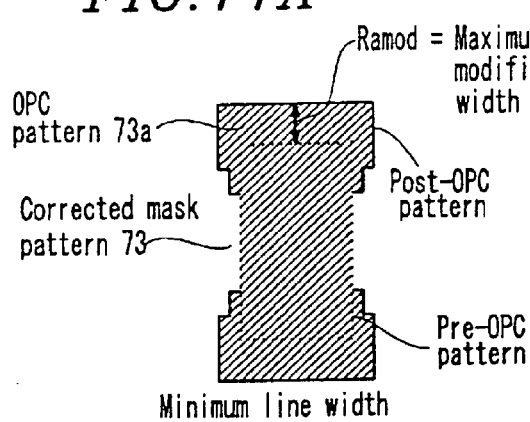
FIGS. 11A and 11B show exemplary evaluation corrected mask patterns.
Figure 11B:
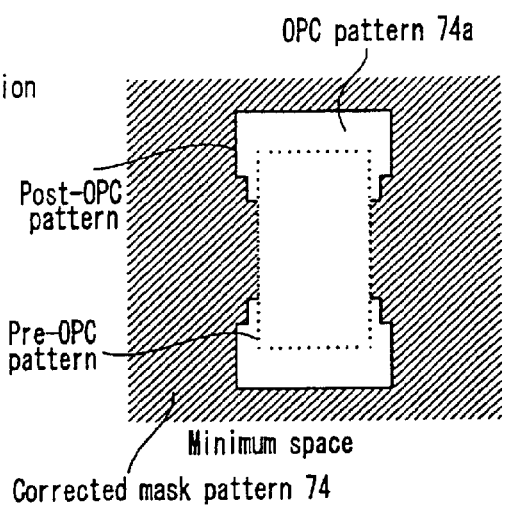

FIGS. 11A and 11B show exemplary evaluation corrected mask patterns. A corrected mask pattern 73 shown in FIG. 11A and a corrected mask pattern 74 shown in FIG. 11B are both an evaluation corrected mask pattern.

The evaluation original mask pattern 71 (FIG. 10A) is OPC-processed based on simulation so as to create the evaluation corrected mask pattern 73. The evaluation corrected mask pattern 73 includes an OPC pattern 73a.

The evaluation original mask pattern 72 (FIG. 10B) is OPC-processed based on simulation so as to create the evaluation corrected mask pattern 74. The evaluation corrected mask pattern 74 includes an OPC pattern 74a.

In the case where the correction amount is determined based on simulation, the correction amount of the mask pattern is determined by optical model calculation, and thus the mask pattern is corrected. The amount of correction performed on the minimum mask pattern which is permitted by the design rule is set as the maximum correction amount. For example, the maximum correction amount of the corrected mask pattern 73 is the maximum modification width Ramod.

FIG. 12 is a flowchart illustrating a method for obtaining the maximum modification width Ramod.

Step 31: The corrected mask pattern verification apparatus 100 sets value $Ra_0$ as the maximum value (initial value). Value $Ra_0$ is sufficiently larger than the modification amount which can be optically expected. After the corrected mask pattern verification apparatus 100 sets value $Ra_0$, the processing goes to step 32.

Step 32: The corrected mask pattern verification apparatus 100 performs substantially the same processing as that of steps 1 through 10 (FIG. 8). As values other than value $Ra_0$ (values Rb, Samin, Sbmin, Samax, Sbmax), such values that will not cause errors in each step are set. For example, Rb=10 $\mu$m, Samin=Sbmin=0 $\mu m^2$, and Samax=Sbmax=10 $\mu m^2$.

When the corrected mask pattern verification apparatus 100 determines in step 32 that "the corrected mask pattern has been abnormally corrected", the processing goes to step 33. When the corrected mask pattern verification apparatus 100 determines in step 32 that "the corrected mask pattern has been properly corrected", the processing goes to step 34.

Step 33: The corrected mask pattern verification apparatus 100 terminates the processing.

Step 34: The corrected mask pattern verification apparatus 100 sets a value obtained by deleting $\Delta Ra$ from $Ra_0$ set as the maximum value (initial value), as value $Ra_1$. After the corrected mask pattern verification apparatus 100 sets value $Ra_1$, the processing goes to step 35.

Step 35: The corrected mask pattern verification apparatus 100 performs substantially the same processing as that of steps 1 through 10 (FIG. 8). As values other than value $Ra_1$ (values Rb, Samin, Sbmin, Samax, Sbmax), such values that will not cause errors in each step are set.

When the corrected mask pattern verification apparatus 100 determines in step 35 that "the corrected mask pattern has been abnormally corrected", the processing goes to step 36. When the corrected mask pattern verification apparatus 100 determines in step 35 that "the corrected mask pattern has been properly corrected", the processing goes to step 37.

Step 36: The corrected mask pattern verification apparatus 100 terminates the processing.

Then, the corrected mask pattern verification apparatus 100 performs substantially the same processing as that of steps 34 through 36 while decreasing the value Ra by $\Delta Ra$.

Step 37: The corrected mask pattern verification apparatus 100 sets a value obtained by deleting ($n \times \Delta Ra$) from $Ra_0$, as value $Ra_n$. After the corrected mask pattern verification apparatus 100 sets value $Ra_n$, the processing goes to step 38.

Step 38: The corrected mask pattern verification apparatus 100 performs substantially the same processing as that of steps 1 through 10 (FIG. 8). As values other than value $Ra_n$ (values Rb, Samin, Sbmin, Samax, Sbmax), such values that will not cause errors in each step are set.

When the corrected mask pattern verification apparatus 100 determines in step 38 that "the corrected mask pattern has been abnormally corrected", the processing goes to step 39. When the corrected mask pattern verification apparatus 100 determines in step 38 that "the corrected mask pattern has been properly corrected", the processing is properly terminated.

Step 39: the corrected mask pattern verification apparatus 100 terminates the processing.

When the minimum unit of the design grid of the original mask pattern (virtual coordinate defining the minimum shape of the mask pattern) is 0.01 $\mu$m and Ramod=0.16 (FIG. 11), the initial value Ra is decreased by value $\Delta Ra$ (optically considered to be sufficiently large). For example, Ra is decreased from 0.30 by ΔRa=0.01. When value Ra=0.16 or greater, no differential mask pattern is left as a result of the graphic reduction-enlargement operation. Accordingly, the corrected mask pattern is found to have been properly performed. When value Ra=0.15 or smaller, at least a portion of the differential mask pattern is left as a result of the graphic reduction-enlargement operation. Therefore, the corrected mask pattern is found to have been abnormally performed.

Using the above-described method, the correction amount can be determined based on simulation.

The value Ra used for graphic reduction-enlargement operation is determined as described above. The other values (Rb, Sbmin, Sbmin, Samax, Sbmax) are also determined similarly.

The correction amount is determined only once when the design rule is determined. Using the determined value, the corrected mask pattern can be verified by the method described above with reference to FIG. 8.

As described above, according to the corrected mask pattern verification apparatus of the present invention, data representing a graphic differential pattern or data representing an graphic exclusive-OR pattern is produced based on the data representing the corrected mask pattern and the data representing the original mask pattern. The data representing the graphic differential pattern or the data representing graphic exclusive-OR pattern is processed by a graphic reduction-enlargement operation, and also by an area comparison operation. Accordingly, it can be verified at high speed and low cost that the corrected mask pattern has been properly corrected according to the present invention.

The corrected mask pattern verification method according to the present invention performs verification of a corrected mask pattern by graphic operations. Accordingly, the time period required for calculation by the corrected mask pattern verification method of the present invention is reduced several times or several ten times than the time period required for calculation by the method disclosed in Japanese Laid-Open Publication No. 11-184064; i.e., the method of verifying that the corrected mask pattern by comparing an original mask pattern and a corrected mask pattern based on optical simulation. Accordingly, it can be verified at high speed and low cost that the corrected mask pattern has been properly corrected according to the present invention.

Hereinafter, an operation of the corrected mask pattern verification apparatus 100 according to the present invention will be specifically described.

The corrected mask pattern 62 (FIG. 3) has OPC mask patterns 62a and 62b in order to prevent the corners of the pattern transferred onto the wafer as a result of the mask exposure from being rounded. The OPC mask pattern 62a projects from a convex corner of the corrected mask pattern 62. Herein, the amount by which the differential mask pattern is projecting from a convex corner of the original mask pattern or recessed from a concave corner of the original mask pattern is defined as the "projecting amount". The projecting amount of the OPC mask pattern 62a is 0.04 μm, and the "overlapping amount" of the OPC mask pattern 62a is 0.10 μm. The OPC mask pattern 62b is recessed from a concave corner of the corrected mask pattern 62. The projecting amount of the OPC mask pattern 62b is 0.06 μm, and the "overlapping amount" of the OPC mask pattern 62b is 0.10 μm.

Figure 13:
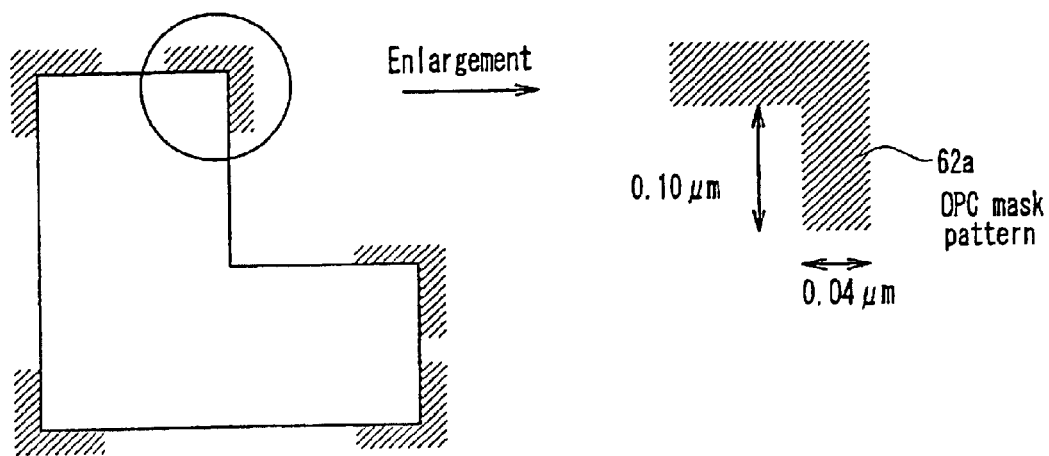

FIG. 13 shows the OPC mask pattern 62a in more detail. The OPC mask pattern 62a is obtained by the graphic differential operation section 3 by deleting the data representing the original mask pattern data 61 (FIG. 2) from the data representing the corrected mask pattern data 62 (FIG. 3).

Figure 14:
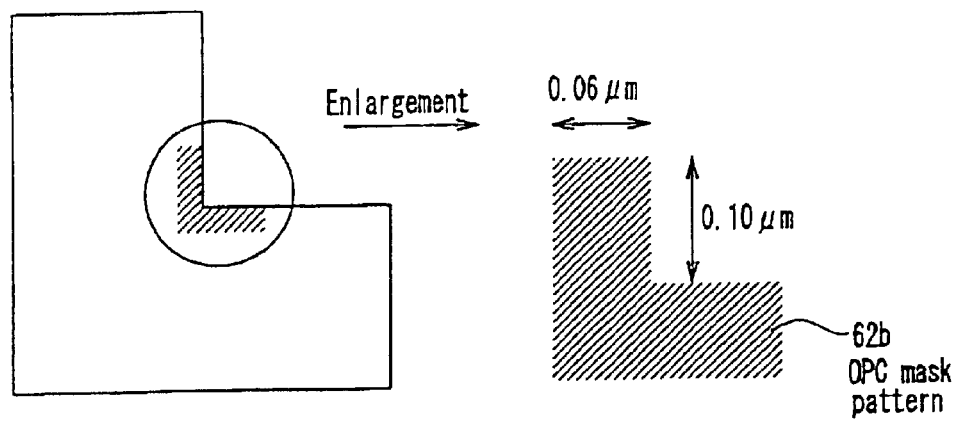
FIG. 14 shows an OPC mask pattern 62b.

FIG. 14 shows the OPC mask pattern 62b in more detail. The OPC mask pattern 62b is obtained by the graphic differential operation section 3 by deleting the data representing the corrected mask pattern data 62 (FIG. 3) from the data representing the original mask pattern data 61 (FIG. 2).

Hereinafter, the verification performed by the graphic reduction-enlargement operation section 4 will be described.

As described above, the projecting amount of the OPC mask pattern 62a (FIG. 13) is 0.04 μm. The graphic reduction-enlargement operation section 4 reduces each side of the OPC mask pattern 62a by 0.02 μm, which is half of 0.04 μm. After the reduction, the graphic reduction-enlargement operation section 4 enlarges each side of the reduced OPC mask pattern 62a by 0.02 μm.

When no OPC mask pattern (the hatched portion of FIG. 13) is left as a result of the graphic reduction-enlargement operation, it is determined that "the corrected mask pattern has been properly corrected".

Again as described above, the projecting amount of the OPC mask pattern 62b (FIG. 14) is 0.06 μm. The graphic reduction-enlargement operation section 4 reduces each side of the OPC mask pattern 62b by 0.03 μm, which is half of 0.06 μm. After the reduction, the graphic reduction-enlargement operation section 4 enlarges each side of the reduced OPC mask pattern 62b by 0.03 μm.

When no OPC mask pattern (the hatched portion of FIG. 14) is left as a result of the graphic reduction-enlargement operation, it is determined that "the corrected mask pattern has been properly corrected".

Figure 15:
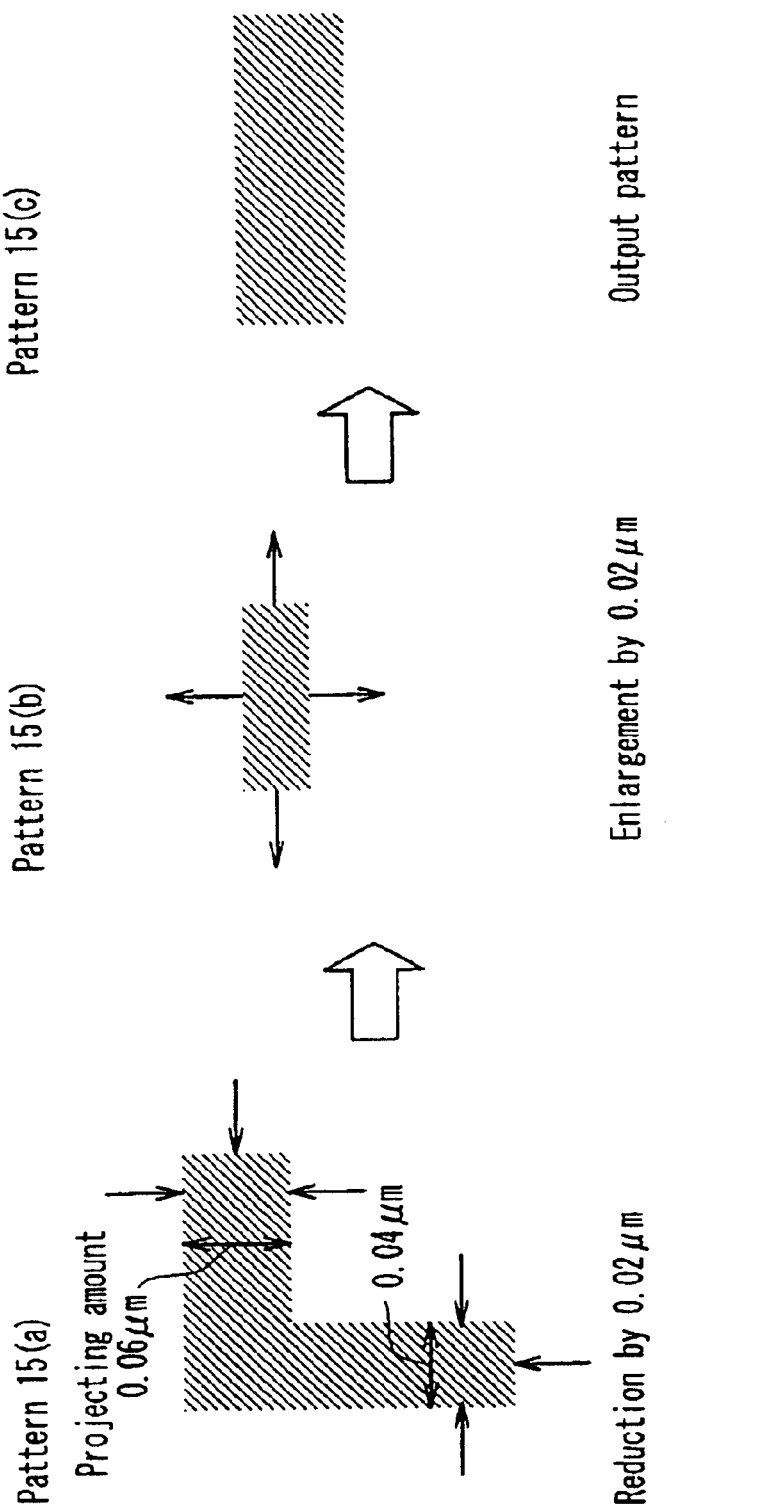
FIG. 15 shows an exemplary differential mask pattern processed by a graphic reduction-enlargement operation.

FIG. 15 shows an exemplary differential mask pattern processed by a graphic reduction-enlargement operation.

Pattern 15(a) is generated by the graphic differential operation section 3 by deleting the original mask pattern data from the corrected mask pattern data. Pattern 15(a) is a differential mask pattern which is larger than the pattern to be applied for correction. Pattern 15(a) is obtained when the correction is not properly performed. The projecting amount of pattern 15(a) is 0.06 μm.

Pattern 15(b) is generated by reducing pattern 15(a) by 0.02 μm by the graphic reduction-enlargement operation section 4. Since pattern 15(a) is larger than the pattern to be applied for correction, there is a portion of pattern 15(a) (a portion having a projection amount of 0.06 μm) left after the reduction.

Pattern 15(c) is generated by enlarging pattern 15(b) by 0.02 μm by the graphic reduction-enlargement operation section 4. Since pattern 15(a) is larger than the pattern to be applied for correction, data including data representing pattern 15(c) is output to the first determination section 6 from the graphic reduction-enlargement operation section 4.

The first determination section 6 determines that "the shape of the corrected mask pattern is different from the desired shape".

Figure 16A:
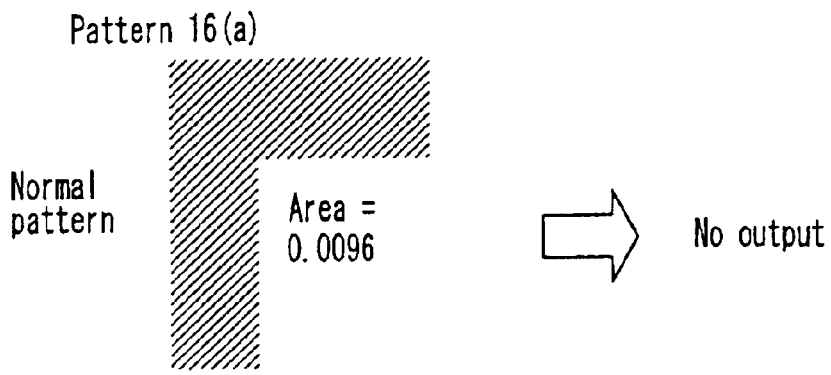
FIGS. 16A and 16B show an example of area comparison operation performed on the differential mask pattern.
Figure 16B:
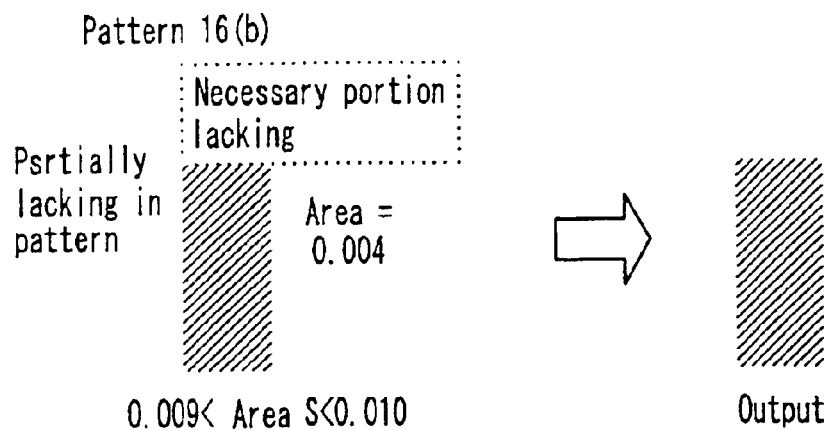

Hereinafter, the verification performed by the area comparison operation section 5 will be described. FIGS. 16A and 16B show an example of area comparison operation performed on the differential mask pattern.

Pattern 16(a) shown in FIG. 16A corresponds to the OPC mask pattern 62a (FIG. 13). Pattern 16(a) is represented by the differential mask pattern which is input to the area comparison operation section 5. Pattern 16(a) has the size of the mask pattern to be applied for correction, and FIG. 16A shows the case where the correction has been properly performed.

The area of pattern 16(a) is 0.096 μm$^2$. The area comparison operation section 5 compares 0.096 μm$^2$ with the minimum value and the maximum value of the prescribed area range for the area. In this example, the minimum value is 0.009 $\mu m^2$ and the maximum value is 0.100 $\mu m^2$. Since 0.096 $\mu m^2$ is within the range, the corrected mask pattern is determined to have been properly corrected.

Pattern 16(b) shown in FIG. 16b is smaller than the mask pattern to be applied for correction, and FIG. 16B shows the case where the correction has not been properly performed.

The area of pattern 16(b) is 0.004 $\mu m^2$. The area comparison operation section 5 compares 0.004 $\mu m^2$ with the minimum value and the maximum value of the prescribed area range for the area. Since 0.004 $\mu m^2$ is smaller than the minimum value of the range, the area comparison operation section 5 outputs data including pattern 16(b) to the second determination section 7. The second determination section 7 determines that "the corrected mask pattern is different from the desired shape."

In the above example, a graphic difference is used for obtaining a differential mask pattern based on an original mask pattern and a corrected mask pattern. Alternatively, a graphic exclusive-OR may be used for obtaining a differential mask pattern. In this case, the operation for finding the differential mask pattern is performed only once, which is time-saving.

When a graphic exclusive-OR is used, values used by the operation need to be adapted to the largest pattern. Therefore, the precision is lower than that when the graphic difference is used.

Figure 17:
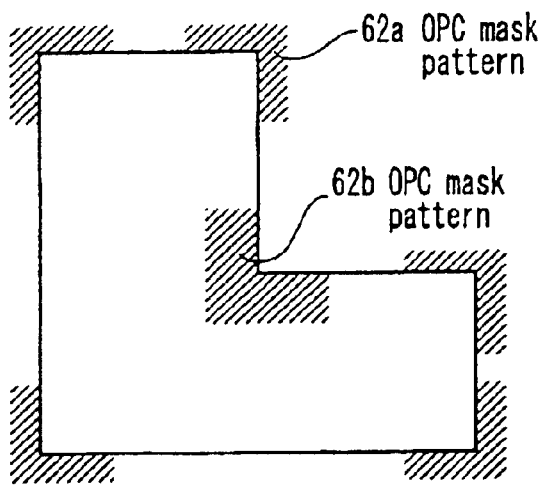
FIG. 17 shows an exemplary differential mask pattern represented by differential mask pattern data.
Figure 18:
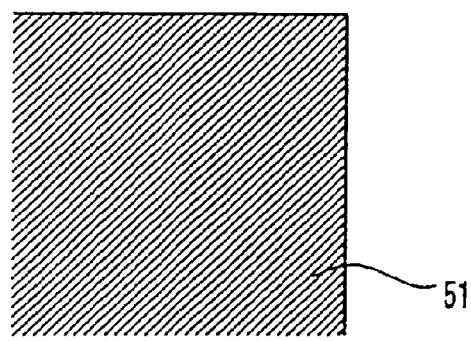
FIG. 18 shows a corner of an original mask (pre-correction mask) 51.
Figure 19:
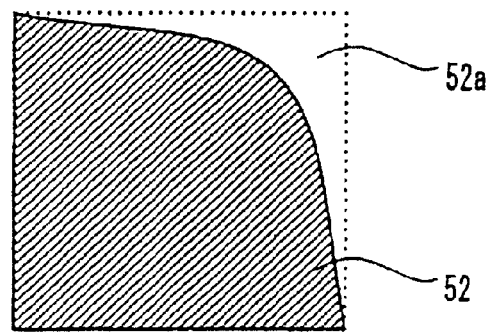
FIG. 19 shows a corner of a pattern 52 transferred by exposing the original mask 51 to light shown in FIG. 18.
Figure 20:
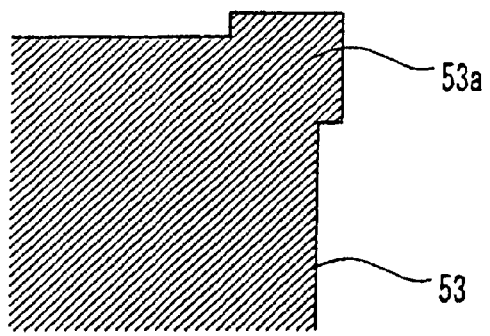
FIG. 20 shows a corrected mask 53 having a pattern corrected by OPC processing.
Figure 21:
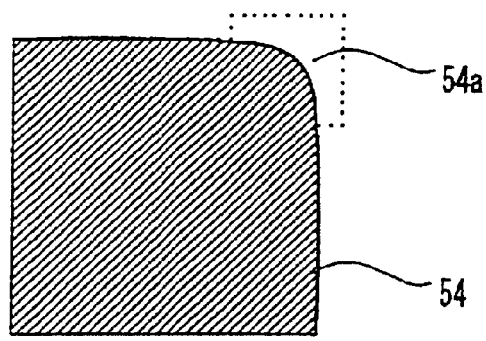
FIG. 21 shows a corner of a pattern 54 transferred by exposing the corrected mask 53 to light shown in FIG. 20.
Figure 22:
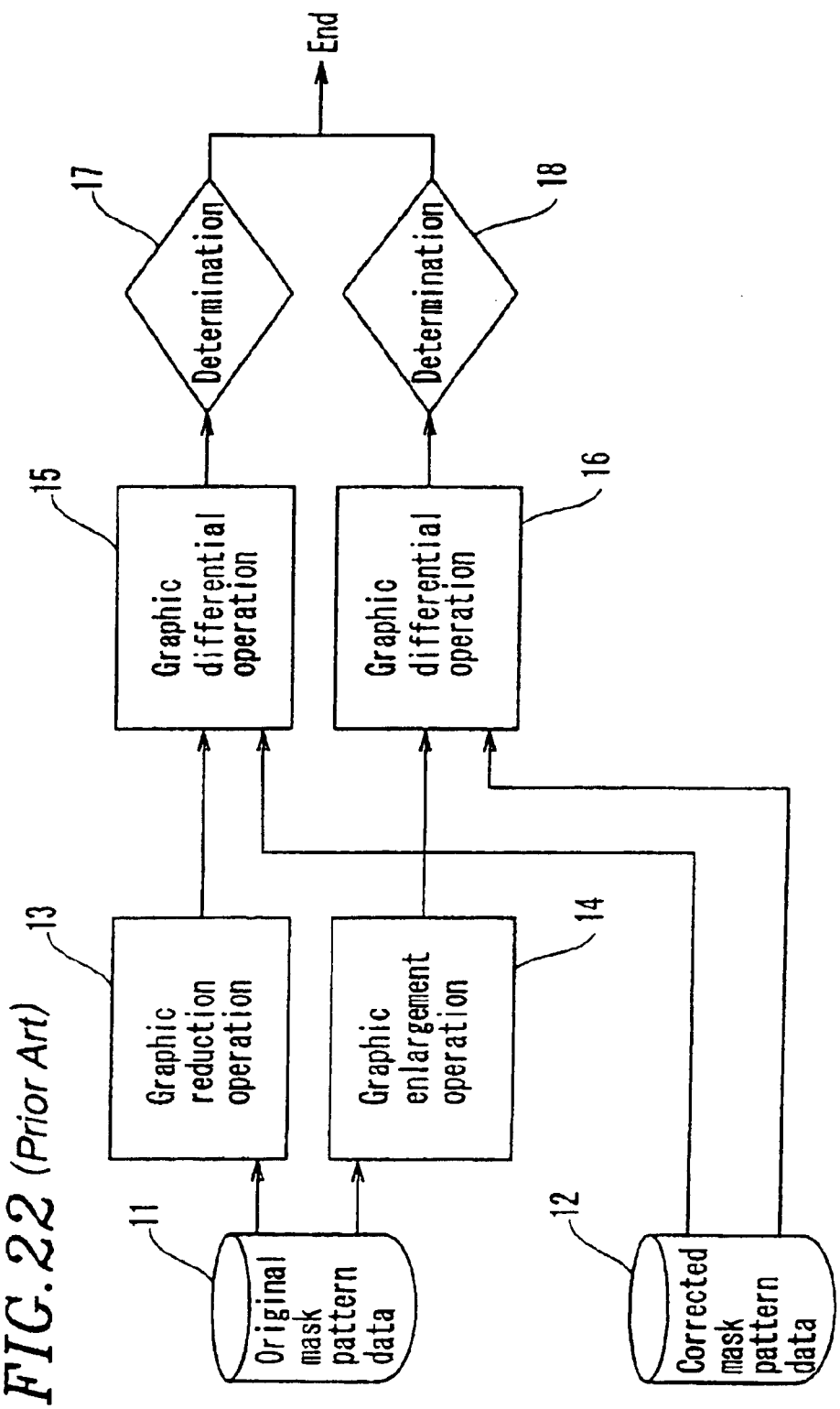
FIG. 22 shows a conventional corrected mask pattern verification method.
Figure 23:
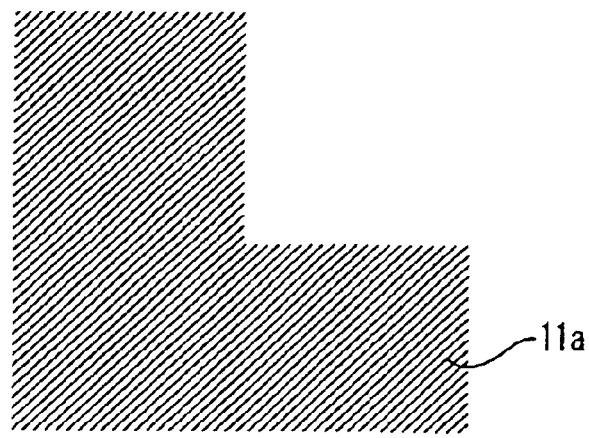
FIG. 23 shows an exemplary original mask pattern represented by an original mask pattern 11 shown in FIG. 22.
Figure 24:
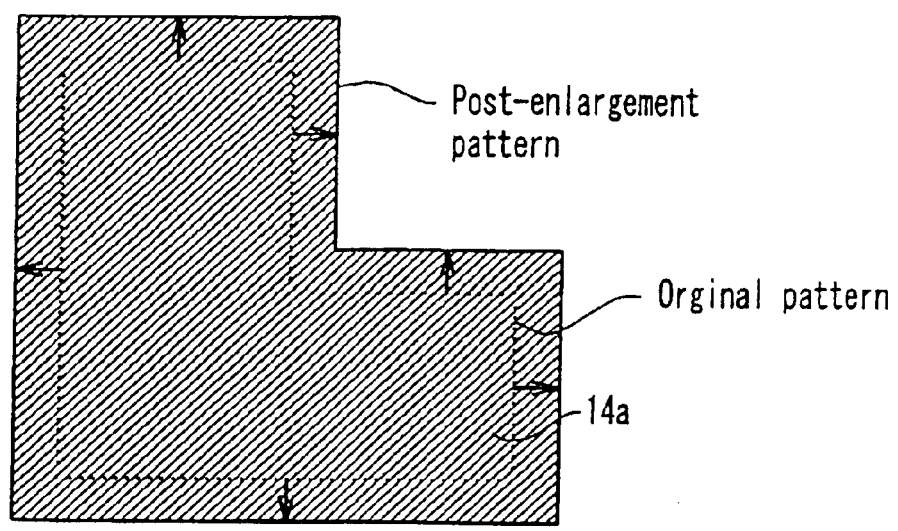
FIG. 24 shows an enlarged mask pattern represented by enlarged mask pattern data.
Figure 25:
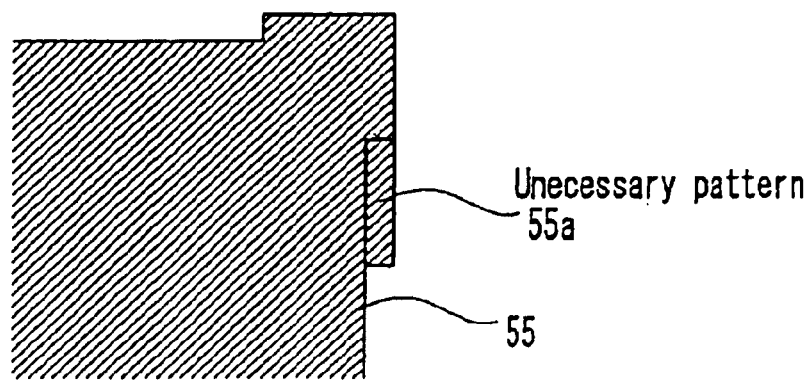
FIG. 25 shows an exemplary corrected mask pattern having an unnecessary portion.
Figure 26:
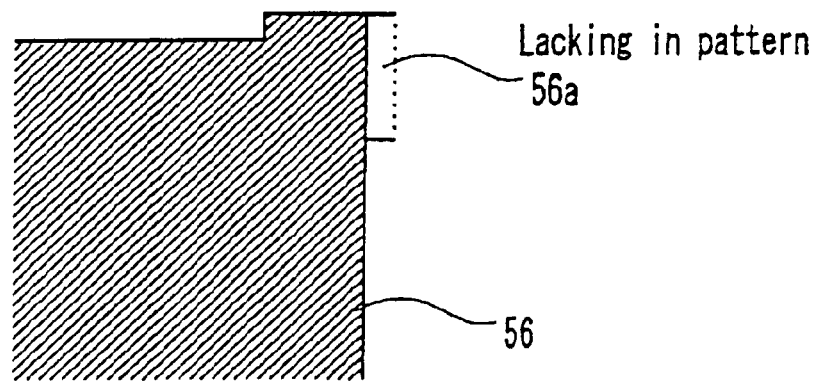
FIG. 26 shows an exemplary corrected mask pattern lacking a necessary portion.

FIG. 17 shows an exemplary differential mask pattern represented by the differential mask pattern data.

When a graphic exclusive-OR is used, length Ra used by the graphic reduction-enlargement operation section 4 needs to be adapted to the largest pattern 62b. When the projecting amount of the pattern 62b is 0.06 $\mu m$, length Ra needs to be shortened to 0.03 $\mu m$, which is half of the projecting amount. Therefore, when the projecting amount of the pattern 62a is larger than 0.06 $\mu m$, it can be detected that the correction of the mask pattern has not been properly performed. When the projecting amount of the pattern 62a is smaller than 0.06 $\mu m$, it cannot be detected that the correction of the mask pattern has not been properly performed even if the correction of the mask pattern has not been properly performed due to the pattern 62a.

It is preferable that a graphic difference or a graphic exclusive-OR are used in accordance with the required detection precision, verification time permitted or the like.

As described above, a corrected mask pattern verification apparatus according to the present invention processes a differential mask pattern obtained based on the graphic difference (which is obtained based on the original mask pattern data and the corrected mask pattern data) or based on the graphic exclusive-OR by a graphic reduction-enlargement operation and also by area comparison operation. Therefore, when a mask pattern for exposure is corrected in consideration of the influence of the optical proximity effect which occurs when exposing the mask, the corrected mask pattern verification apparatus of the present invention can check whether or not the "corrected mask pattern has been properly corrected" at high speed and low cost.

In addition, the corrected mask pattern verification apparatus of the present invention can check whether or not "the corrected mask pattern is appropriate for the production process of a semiconductor integrated circuit" with very high precision, without using optical simulation requiring a long calculation time and thus increasing the cost.

When the corrected mask pattern has been properly corrected, such a mask pattern reproduces the pattern of the layout of the semiconductor integrated circuit represented by the design data with high fidelity. Therefore, the resultant semiconductor integrated circuit operates properly. This improves the production yield of, and lowers the cost of, the semiconductor integrated circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A corrected mask pattern verification apparatus for verifying that corrected mask pattern data generated based on design mask pattern data has been properly corrected, the corrected mask pattern verification apparatus comprising:

a graphic operation section for performing a prescribed graphic operation based on the design mask pattern data and the corrected mask pattern data so as to generate differential mask pattern data indicating a result of the prescribed graphic operation;

a graphic reduction-enlargement operation section for reducing the differential mask pattern data and enlarging the differential mask pattern data obtained by the reduction, and generating graphic reduction-enlargement operation data indicating a graphic reduction-enlargement operation result;

a first determination section for determining whether or not the graphic reduction-enlargement operation data includes the differential mask pattern, and generating first determination result data indicating a determination result thereof;

an area comparison operation section for calculating an area of a differential mask pattern represented by the differential mask pattern data and comparing the calculated area with a prescribed area, and generating area comparison operation data indicating an area comparison operation result;

a second determination section for determining whether or not the area comparison operation data includes the differential mask pattern data and generating second determination result data indicating a determination result thereof; and a third determination section for determining whether or not the corrected mask pattern data has been properly corrected based on the first determination result data and the second determination result data.

2. A corrected mask pattern verification apparatus according to claim 1, wherein the result of the prescribed graphic operation is a graphic difference obtained from the design mask pattern data and the corrected mask pattern data.

3. A corrected mask pattern verification apparatus according to claim 1, wherein the result of the prescribed graphic operation is a graphic exclusive-OR obtained from the design mask pattern data and the corrected mask pattern data.

4. A corrected mask pattern verification method for verifying that corrected mask pattern data generated based on design mask pattern data has been properly corrected, the corrected mask pattern verification method, comprising:

(a) a first graphic differential operation step of deleting the design mask pattern data from the corrected mask pattern data, thereby generating first differential mask pattern data representing a first differential mask pattern;

(b) a first graphic reduction-enlargement operation step of performing a first reduction on the first differential mask pattern data and then performing a first enlargement on the first mask pattern data obtained by the first reduction, thereby generating first graphic reduction-enlargement operation data indicating a first graphic reduction-enlargement operation result;

(c) a first determination step of determining whether or not the first graphic reduction-enlargement operation data includes the first differential mask pattern data, thereby generating first determination result data indicating a result thereof;

(d) a first area comparison operation step of calculating an area of the first differential mask pattern based on the first differential mask pattern data, and comparing the area of the first differential mask pattern with a first prescribed area, thereby generating first area comparison operation data indicating a result thereof;

(e) a second determination step of determining whether or not the first area comparison operation data includes the first differential mask pattern data, thereby generating second determination result data indicating a result thereof;

(f) a second graphic differential operation step of deleting the corrected mask pattern data from the design mask pattern data, thereby generating second differential mask pattern data representing a second differential mask pattern;

(g) a second graphic reduction-enlargement operation step of performing a second reduction on the second differential mask pattern data and then performing a second enlargement on the second mask pattern data obtained by the second reduction, thereby generating second graphic reduction-enlargement operation data indicating a second graphic reduction-enlargement operation result;

(h) a third determination step of determining whether or not the second graphic reduction-enlargement operation data includes the second differential mask pattern data, thereby generating third determination result data indicating a result thereof;

(i) a second area comparison operation step of calculating an area of the second differential mask pattern based on the second differential mask pattern data, and comparing the area of the second differential mask pattern with a second prescribed area, thereby generating second area comparison operation data indicating a result thereof;

(j) a fourth determination step of determining whether or not the second area comparison operation data includes the second differential mask pattern data, thereby generating fourth determination result data indicating a result thereof; and (k) a fifth determination step of determining whether or not the corrected mask pattern data has been properly corrected based on the first determination result data, the second determination result data, the third determination result data, and the fourth determination result data.

5. A corrected mask pattern verification method according to claim 4, wherein:

the first reduction shortens each of the sides of the first differential mask pattern by a first prescribed amount, the first enlargement extends each of the sides of the first differential mask pattern obtained by the first reduction by a second prescribed amount, the second reduction shortens each of the sides of the second differential mask pattern by a third prescribed amount, the second enlargement extends each of the sides of the second differential mask pattern obtained by the second reduction by a fourth prescribed amount, and the corrected mask pattern includes a plurality of regions, the corrected mask pattern verification method further comprising:

(1) performing steps (a) through (k) for each of the plurality of regions, wherein for each performance of step (1), the first prescribed amount, the second prescribed amount, the third prescribed amount, the fourth prescribed amount, the first prescribed area, and the second prescribed area are set.

6. A corrected mask pattern verification method according to claim 4, wherein:

the first reduction shortens each of the sides of the first differential mask pattern by a first prescribed amount, the first enlargement extends each of the sides of the first differential mask pattern obtained by the first reduction by a second prescribed amount, the second reduction shortens each of the sides of the second differential mask pattern by a third prescribed amount, and the second enlargement extends each of the sides of the second differential mask pattern obtained by the second reduction by a fourth prescribed amount, the corrected mask pattern verification method further comprising:

(m) performing steps (a) through (k), wherein for each performance of step (m), the first prescribed amount, the second prescribed amount, the third prescribed amount, and the fourth prescribed amount are each shortened by a prescribed length, and wherein each of the shortened first prescribed amount, the shortened second prescribed amount, the shortened third prescribed amount, and the shortened fourth prescribed amount is set as a maximum correction amount based on the result obtained by step (k) which is performed each time step (m) is performed.

7. A corrected mask pattern verification method for verifying that corrected mask pattern data generated based on design mask pattern data has been properly corrected, the corrected mask pattern verification method, comprising:

(a) a graphic operation step of generating a differential mask pattern data representing an exclusive-OR of the design mask pattern data and the corrected mask pattern data;

(b) a graphic reduction-enlargement operation step of performing a reduction on the differential mask pattern data and then performing an enlargement on the differential mask pattern data obtained by the reduction, thereby generating graphic reduction-enlargement operation data indicating a graphic reduction-enlargement operation result;

(c) a first determination step of determining whether or not the graphic reduction-enlargement operation data includes the differential mask pattern data, thereby generating first determination result data indicating a result thereof;

(d) an area comparison operation step of calculating an area of the differential mask pattern based on the differential mask pattern data, and comparing the calculated area of the differential mask pattern with a prescribed area, thereby generating area comparison operation data indicating a result thereof;

(e) a second determination step of determining whether or not the area comparison operation data includes the differential mask pattern data, thereby generating second determination result data indicating a result thereof; and (f) a third determination step of determining whether or not the corrected mask pattern data has been properly corrected based on the first determination result data and the second determination result data.

8. A corrected mask pattern verification method according to claim 7, wherein:

the reduction shortens each of the sides of the differential mask pattern by a first prescribed amount, the enlargement extends each of the sides of the differential mask pattern obtained by the reduction by a second prescribed amount, and the corrected mask pattern includes a plurality of regions, the corrected mask pattern verification method further comprising:

(g) performing steps (a) through (f) for each of the plurality of regions, wherein for each performance of step (g), the first prescribed amount, the second prescribed amount, and the prescribed area are set.

9. A corrected mask pattern verification method according to claim 7, wherein:

the reduction shortens each of the sides of the differential mask pattern by a first prescribed amount, and the enlargement extends each of the sides of the differential mask pattern obtained by the reduction by a second prescribed amount, the corrected mask pattern verification method further comprising:

(h) performing steps (a) through (f), wherein for each performance of step (h), the first prescribed amount and the second prescribed amount are each shortened by a prescribed length, and wherein each of the shortened first prescribed amount and the shortened second prescribed amount is set as a maximum correction amount of the corrected mask pattern based on the result obtained by step (f) which is performed each time step (h) is performed.

* * * * *